(12) United States Patent
Ahn

(10) Patent No.: US 10,748,875 B2
(45) Date of Patent: Aug. 18, 2020

(54) APPARATUS OF SEMICONDUCTOR MEMORY AND METHOD OF MANUFACTURING THE SAME

(71) Applicant: Samsung Electronics Co., Ltd., Suwon-si, Gyeonggi-do (KR)

(72) Inventor: Jung Seok Ahn, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/285,656

(22) Filed: Feb. 26, 2019

(65) Prior Publication Data

US 2020/0118976 A1 Apr. 16, 2020

(30) Foreign Application Priority Data

Oct. 15, 2018 (KR) .................. 10-2018-0122509

(51) Int. Cl.
*H01L 27/108* (2006.01)
*H01L 25/065* (2006.01)

(52) U.S. Cl.
CPC .... *H01L 25/0657* (2013.01); *H01L 27/10805* (2013.01); *H01L 27/10844* (2013.01)

(58) Field of Classification Search
CPC .................. H01L 27/10844; H01L 27/10805
See application file for complete search history.

(56) References Cited

U.S. PATENT DOCUMENTS

| | | | |
|---|---|---|---|
| 8,872,350 B2 | 10/2014 | Sawachi et al. | |
| 9,960,328 B2 | 5/2018 | Clark et al. | |
| 9,984,999 B2 | 5/2018 | Lee et al. | |
| 2004/0039122 A1 | 2/2004 | Morita et al. | |
| 2011/0005596 A1 | 1/2011 | Shin et al. | |
| 2017/0345798 A1 | 11/2017 | Yu et al. | |
| 2018/0082981 A1 | 3/2018 | Gowda | |
| 2018/0138101 A1 | 5/2018 | Yu et al. | |

FOREIGN PATENT DOCUMENTS

| | | |
|---|---|---|
| KR | 10-0790793 B1 | 1/2008 |
| KR | 10-1107069 B1 | 1/2012 |
| KR | 10-1653856 B1 | 9/2016 |

*Primary Examiner* — Douglas M Menz
(74) *Attorney, Agent, or Firm* — Harness, Dickey & Pierce, P.L.C.

(57) ABSTRACT

A method of manufacturing a semiconductor memory apparatus, in which a plurality of memory dies are stacked, includes forming first memory dies on a wafer. An under-fill material is deposited on a wafer, on which the first memory dies are formed, to form a first part of an under-fill layer. A first portion of the under-fill layer remaining on top surfaces of the first memory dies is removed by performing a half sawing process, and parts of edge portions of the first memory dies are removed during the removal of the first portion of the under-fill layer to form first cavities. Second memory dies are formed on the first memory dies. The under-fill material is deposited on the wafer including the second memory dies formed thereon to form a second part of the under-fill layer on a remaining part of the under-fill layer.

20 Claims, 16 Drawing Sheets

US 10,748,875 B2

APPARATUS OF SEMICONDUCTOR MEMORY AND METHOD OF MANUFACTURING THE SAME

CROSS-REFERENCE TO RELATED APPLICATION

This U.S. non-provisional patent application claims priority under 35 U.S.C. § 119 to Korean Patent Application No. 10-2018-0122509, filed on Oct. 15, 2018, in the Korean Intellectual Property Office (KIPO), the disclosure of which is incorporated by reference herein in its entirety.

BACKGROUND

1. Field

Apparatuses and methods consistent with example embodiments relate to a semiconductor memory apparatus of which a size may be reduced by stacking memory chips of the same kind without using an interposer, and a method of manufacturing the same.

2. Description of Related Art

A chip stacking structure, in which memory dies are stacked on a wafer in a vertical direction, is being applied so as to increase a memory capacity and a data processing capacity per unit area. After the memory dies are vertically stacked on the wafer, the wafer may be cut into individual chip package units, and each chip package may be bonded to a controller and a printed circuit board (PCB). Memory dies of the same kind may be stacked on the wafer and connected to the controller via through-silicon vias (TSVs). A conventional semiconductor memory apparatus may need a large substrate wafer to stack the memory dies of the same kind. Since the conventional semiconductor memory apparatus uses an interposer, an interposer wafer is needed in the conventional semiconductor memory apparatus.

SUMMARY

Example embodiments of inventive concepts are directed to providing a semiconductor memory apparatus of which a size may be reduced by stacking chips of the same kind without using an interposer, and a method of manufacturing the same.

According to example embodiments, there is provided a method of manufacturing a semiconductor memory apparatus in which a plurality of memory dies are stacked. The method includes forming a plurality of first memory dies on a wafer; depositing an under-fill material on the wafer including the plurality of first memory dies formed thereon to form a first part of an under-fill layer, the first part of the under-fill layer including a first portion of the under-fill layer remaining on top surfaces of the plurality of first memory dies; performing a first half sawing process, the first half sawing process removing the first portion of the under-fill layer, the first half sawing process removing parts of edge portions of the plurality of first memory dies to form first cavities during the removing the first portion of the under-fill layer; forming a plurality of second memory dies on the plurality of first memory dies; depositing the under-fill material on the wafer including the plurality of second memory dies to form a second part of the under-fill layer on a remaining part of the under-fill layer, the second part of the under-fill layer including a second portion remaining on top surfaces of the plurality of second memory dies; performing a second half sawing process, the second half sawing process removing the second portion of the under-fill layer, the second half sawing process removing parts of edge portions of the plurality of second memory dies to form second cavities during the removing the second portion of the under-fill layer.

According to example embodiments, there is provided a method of manufacturing a semiconductor memory apparatus in which a plurality of memory dies are stacked. The method includes forming a plurality of first memory dies on a wafer; removing parts of edge portions of the plurality of first memory dies to form first cavities; depositing an under-fill material on the wafer including the plurality of first memory dies formed thereon to form a first part of an under-fill layer; forming a plurality of second memory dies on the plurality of first memory dies; removing parts of edge portions of the plurality of second memory dies to form second cavities; and depositing the under-fill material including the plurality of second memory dies formed thereon to form a second part of the under-fill layer.

According to example embodiments, a semiconductor memory apparatus may include a first memory die on a substrate, a second memory die on the first memory die, a third memory die on the second memory die, and a fourth memory die on the third memory die. The first memory die may include a step between an edge portion and a top surface of the first memory die. The step of the first memory die may be defined by a part of the edge portion of the first memory die being removed. The second memory may include a step between an edge portion and a top surface of the second memory die. The step of the second memory die may be defined by a part of the edge portion of the second memory die being removed. The third memory die may include a step between an edge portion and a top surface of the third memory die. The step of the third memory die may be defined by a part of the edge portion of the third memory die being removed.

DETAILED DESCRIPTION

A semiconductor memory apparatus and a method of manufacturing the same according to embodiments of inventive concepts will be described with reference to the accompanying drawings.

Figure 1:
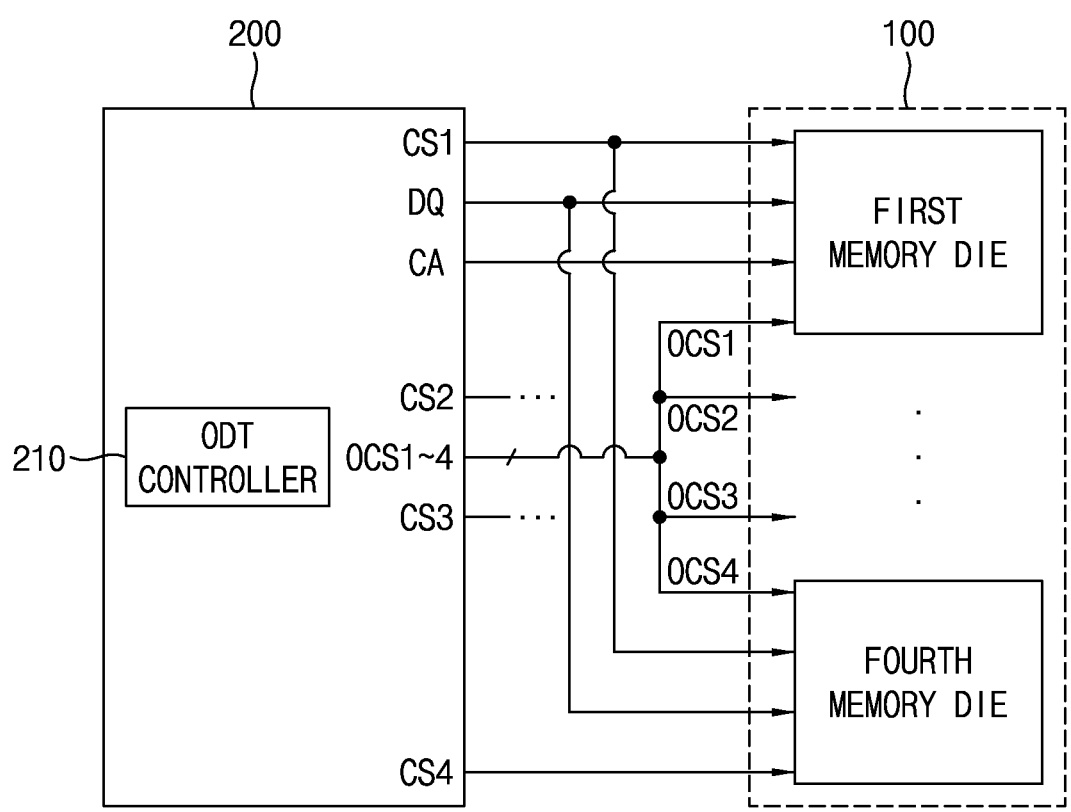
FIG. 1 is a view illustrating a semiconductor chip module according to an embodiment of inventive concepts.
Figure 2:
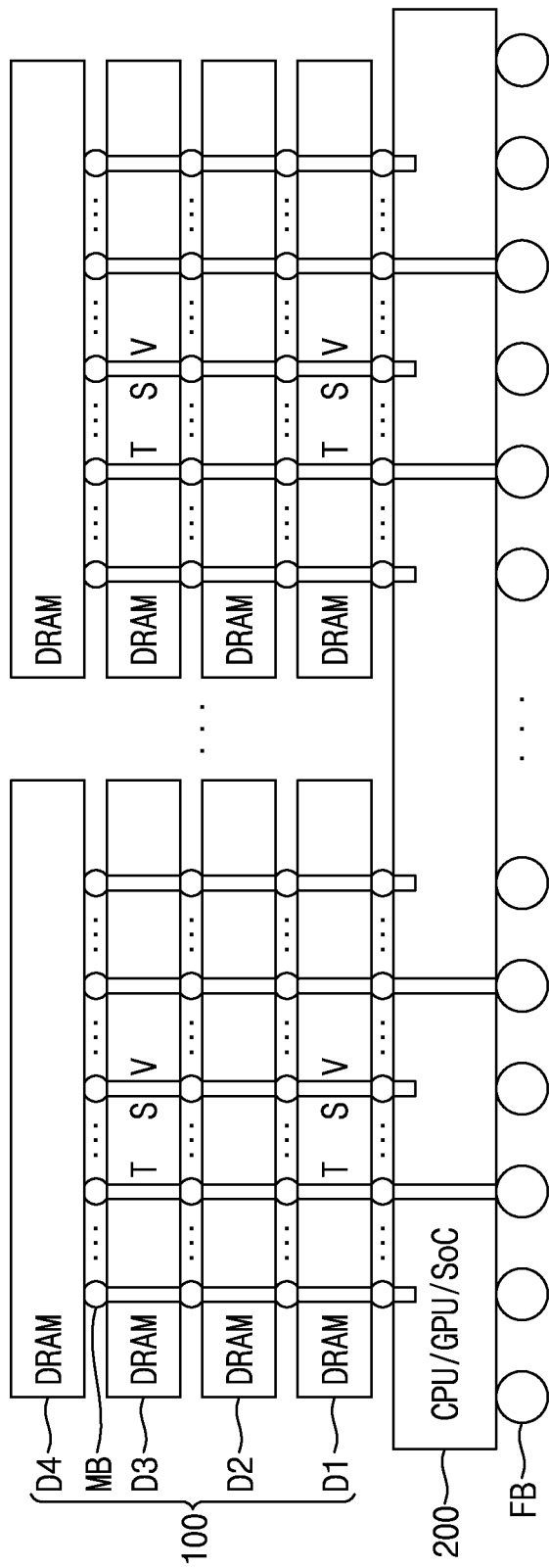
FIG. 2 is a view illustrating a plurality of semiconductor memory apparatuses disposed on a substrate.

FIG. 1 is a view illustrating a semiconductor chip module according to an embodiment of inventive concepts. FIG. 2 is a view illustrating a plurality of semiconductor memory apparatuses disposed on a substrate.

Referring to FIGS. 1 and 2, the semiconductor chip module may include a semiconductor memory apparatus 100 and a controller 200.

The semiconductor memory apparatus 100 may have a multi-chip package structure in which a plurality of memory dies D1 to D4 are stacked in a vertical direction. The plurality of memory dies D1 to D4 may be identical memory dies having the same size. A first memory die D1 may be disposed on a wafer, and a second memory die D2 may be disposed on the first memory die D1. A third memory die D3 may be disposed on the second memory die D2. A fourth memory die D4 may be disposed on the third memory die D3. The first to fourth memory dies D1 to D4 may be connected to a controller 200 through a plurality through-silicon vias (TSVs). The TSVs disposed to vertically correspond to each other may be connected to each other through microbumps MB disposed between the plurality of memory dies D1 to D4.

The semiconductor memory apparatus 100 may be a high-bandwidth memory (HBM) in which a plurality of memory dies D1 to D4 are stacked. FIG. 2 illustrates an example in which a semiconductor chip module is configured using a three-dimensional (3D) solution method. However, inventive concepts are not limited thereto, and the semiconductor chip module may be configured using a 2.5-dimensional (2.5D) solution method.

Although FIGS. 1 and 2 illustrate a case in which four memory dies D1 to D4 are stacked, inventive concepts are not limited thereto, and two memory dies or at least six memory dies may be stacked. The controller 200 may include an on-die termination (ODT) controller 210 configured for ODT control. The semiconductor memory apparatus 100 may be connected to the controller 200 through a plurality of flip-chip bumps FB.

The first memory die D1 may be activated in response to a first chip selection signal CS1 from the controller 200. The first memory die D1 may receive a command and address CA as a control signal from the controller 200. The first memory die D1 may receive write data from the controller 200 or transmit read data to the controller 200. The first memory die D1 may receive data DQ during a write operation from the controller 200 or may transmit data DQ during a read operation to the controller 200.

The first memory die D1 may perform ODT on the first memory die D1 in response to a first on-die control signal OCS1 from the ODT controller 210 included in the controller 200.

The second memory die D2 may be activated in response to a second chip selection signal CS2 from the controller 200. The second memory die D2 may receive a command and address CA as a control signal from the controller 200. The second memory die D2 may receive write data from the controller 200 or transmit read data to the controller 200. The second memory die D2 may receive data DQ during a write operation from the controller 200 or may transmit data DQ during a read operation to the controller 200.

The second memory die D2 may perform ODT on the second memory die D2 in response to a second on-die control signal OCS2 from the ODT controller 210 included in the controller 200.

The third memory die D3 and the fourth memory die D4 may also receive control signals from the controller 200 and operate, like the first memory die D1 and the second memory die D2. The third memory die D3 and the fourth memory die D4 may be activated in response to a third chip selection signal CS3 and a fourth chip selection signal CS4, respectively. The third memory die D3 may receive a command and address CA as a control signal from the controller 200. The fourth memory die D3 may receive a command and address CA as a control signal from the controller 200. The third memory die D3 may receive data DQ during a write operation from the controller 200 or may transmit data DQ during a read operation to the controller 200. The fourth memory die D4 may receive data DQ during a write operation from the controller 200 or may transmit data DQ during a read operation to the controller 200. The third memory die D3 may perform ODT on the third memory die D3 in response to a third on-die control signal OCS3 from the ODT controller 210 included in the controller 200. The fourth memory die D4 may perform ODT on the fourth memory die D4 in response to a fourth on-die control signal OCS4 from the ODT controller 210 included in the controller 200.

The controller 200 shown in FIGS. 1 and 2 may be an Android, iOS, Windows Phone, bada, PDA, BlackBerry, or a mobile application (AP) that is driven in a mobile operating system (OS). The semiconductor memory apparatus 100 shown in FIGS. 1 and 2 may be a dynamic random access memory (DRAM).

Figure 3A:
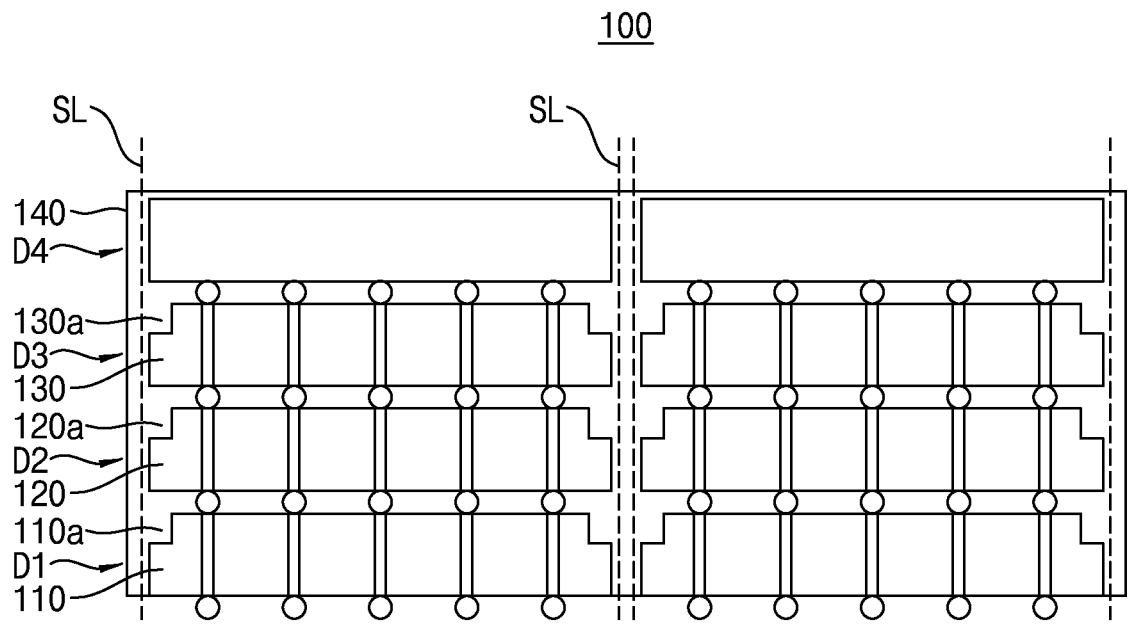
FIGS. 3A and 3B are views illustrating a semiconductor memory apparatus according to an embodiment of inventive concepts, in which edge portions of a top surface of a memory die are removed.
Figure 3B:
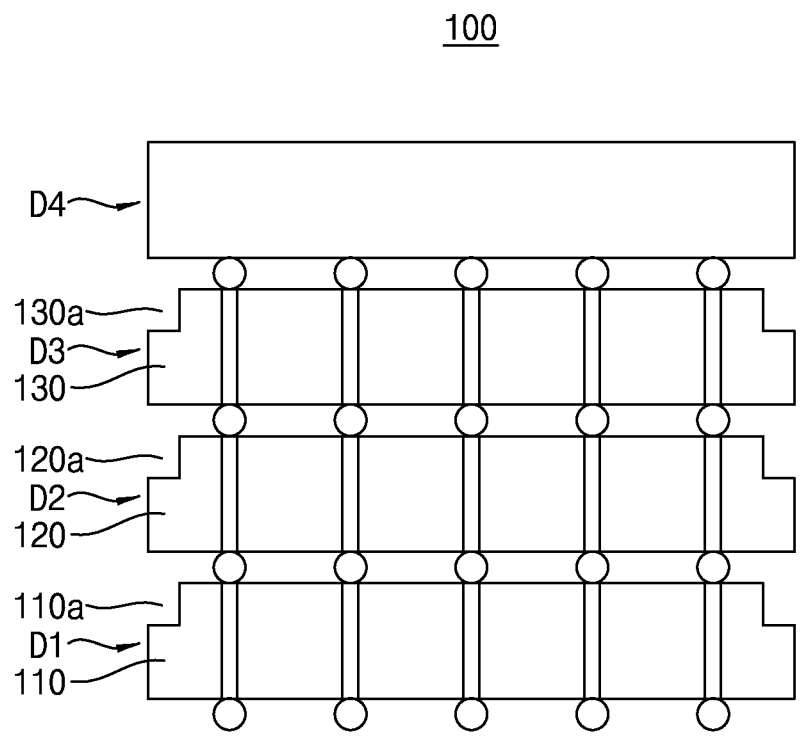

FIGS. 3A and 3B are views illustrating a semiconductor memory apparatus 100 according to an embodiment of inventive concepts, in which a top end portion of a memory die is removed.

Referring to FIGS. 3A and 3B, the semiconductor memory apparatus 100 according to an embodiment of inventive concepts may be manufactured by removing the upper edge portion of the memory die. When an under-fill is deposited during a process of manufacturing the semiconductor memory apparatus 100, the under-fill may overflow on a top surface of the memory die. In the semiconductor memory apparatus 100 according to inventive concepts, the remaining under-fill may be removed from the top surface of the memory die to limit and/or prevent contamination of the top surface of the memory die with the under-fill.

As an example, after depositing the under-fill, a desired (and/or alternatively predetermined) part of the edge portion of the memory die may be removed during the process of removing the under-fill to form a cavity.

As an example, desired (and/or alternatively predetermined) parts of edge portions 110, 120, and 130 of the memory die may be removed to form cavities 110a, 120a, and 130a, and the cavities 110a, 120a, and 130a may be filled with the under-fill.

From among the plurality of memory dies D1 to D4 stacked in the vertical direction, the edge portions 110, 120, and 130 of top surfaces of the first to third memory dies D1 to D3 except for the fourth memory die D4 disposed at an uppermost level may be removed to form the cavities 110a, 120a, and 130a. That is, the edge portions 110, 120, and 130 of the first memory die D1, the second memory die D2, and the third memory die D3 may be removed by a desired (and/or alternatively predetermined) depth so that steps may be formed between the edge portions 110, 120, and 130 and the top surfaces of the first to third memory dies D1 to D3. Since another memory die is not stacked on the fourth memory die D4 disposed at the uppermost level, the fourth memory die D4 may not be affected by the under-fill. It may be unnecessary to form a separate cavity in the fourth memory die D4 disposed at the uppermost level.

Since an interposer is not disposed in the semiconductor memory apparatus 100 of inventive concepts, it may be unnecessary to apply an interposer wafer during a manufacturing process. Accordingly, one wafer may be saved during the manufacture of the semiconductor memory apparatus 100 and thus, manufacturing costs may be reduced. Further, memory die stacks may be disposed adjacent to each other so that a distance between scribe lanes may be reduced and more semiconductor memory apparatuses 100 may be manufactured using one wafer.

FIGS. 4 to 18 are views illustrating a method of manufacturing a semiconductor memory apparatus according to an embodiment of inventive concepts.

Figure 4:
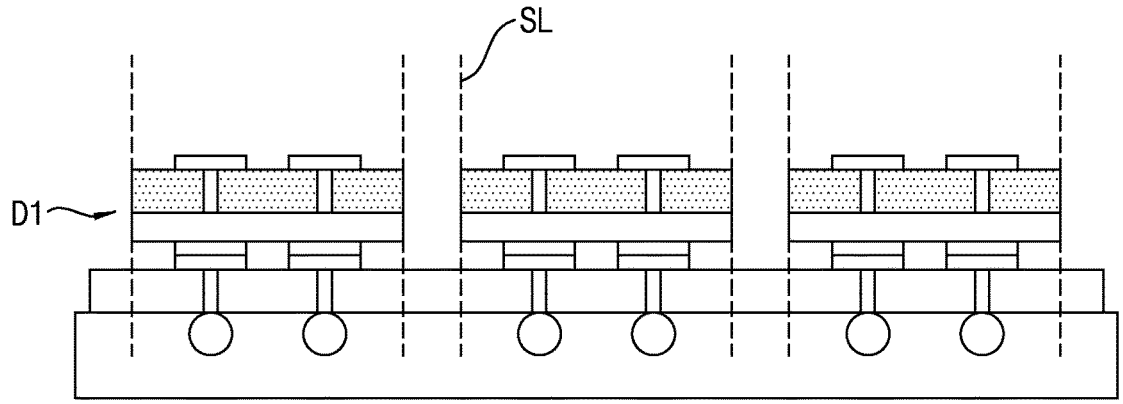
FIGS. 4 to 18 are views illustrating a method of manufacturing a semiconductor memory apparatus according to an embodiment of inventive concepts.

Referring to FIG. 4, a plurality of first memory dies D1 may be formed on a wafer. The plurality of first memory dies D1 may be disposed a desired (and/or alternatively predetermined) distance apart from each other so that a scribing process may be performed after the stacking of memory dies D1 to D4 is completed.

Figure 5:
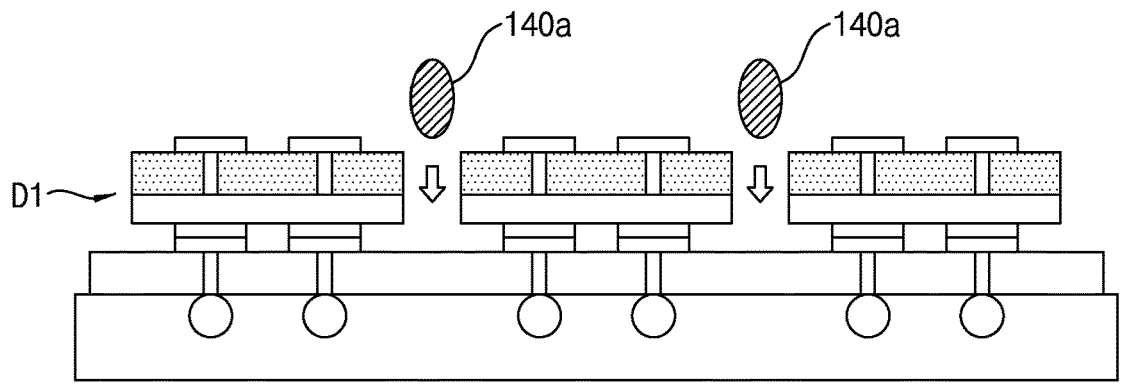

Thereafter, referring to FIG. 5, an under-fill material 140a may be deposited along a scribe lane SL on the wafer on which the first memory dies D1 are disposed.

Figure 6:
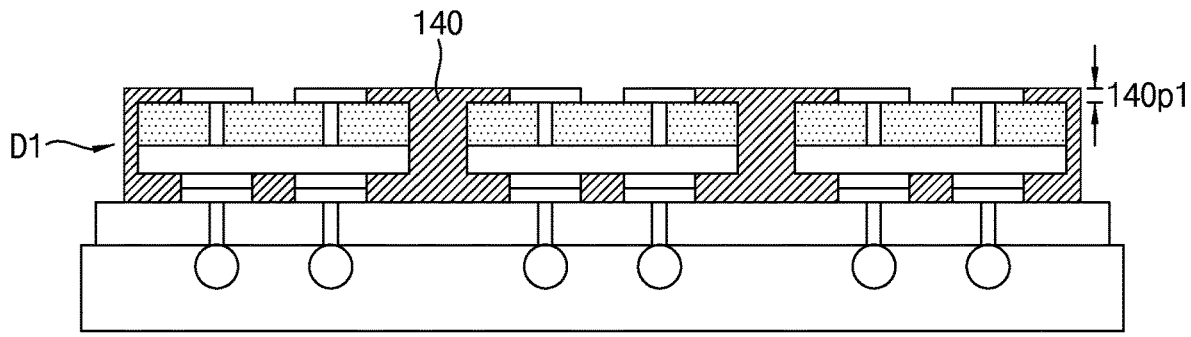

Subsequently, referring to FIG. 6, the under-fill material 140a deposited on the wafer may be sintered to form an under-fill layer 140. In this case, part of the under-fill material 140a may overflow on a top surface of the first memory die D1. When the under-fill layer 140 remains on the top surface of the first memory die D1, the remaining under-fill layer 140 may hinder a subsequent process of stacking the second memory die D2. The remaining under-fill layer 140 on the top surface of the first memory die D1 may be referred to as a first portion 140p1 of the under-fill layer 140.

Figure 7A:
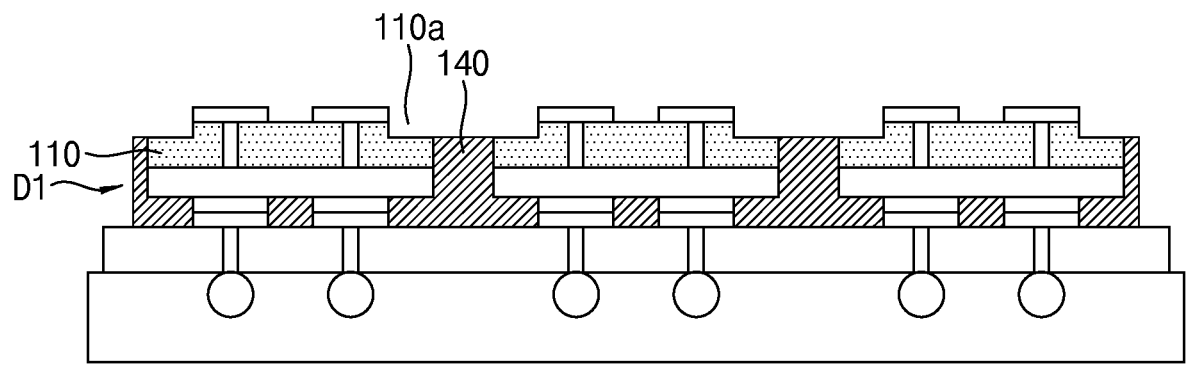

Referring to FIG. 7A, a half sawing process may be performed to remove the first portion 140p1 of the under-fill layer 140 remaining on the top surface of the first memory die D1. In this case, during the removal of the under-fill layer 140, an edge portion 110 of the first memory die D1 may be removed by a desired (and/or alternatively predetermined) thickness along with the under-fill layer 140. The edge portion 110 of the first memory die D1 may be removed by the desired (and/or alternatively predetermined) thickness to form a first cavity 110a.

Figure 7B:
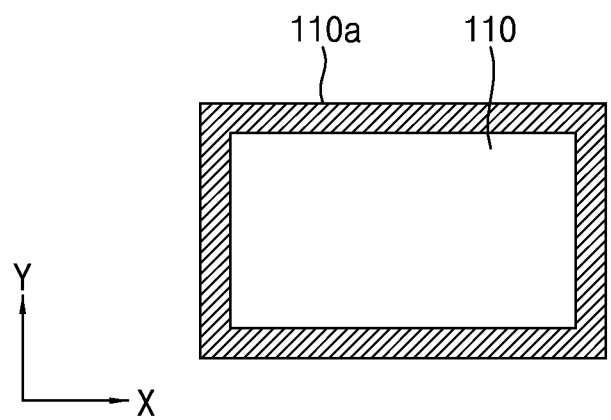

Referring to FIG. 7B, edge portions 110 of four surfaces of the first memory die D1 may be removed by a desired (and/or alternatively predetermined) thickness to form first cavities 110a. That is, the first cavities 110a may be formed by wholly removing both X-axial edge portions 110 and both Y-axial edge portions 110 of the first memory die D1.

Figure 7C:
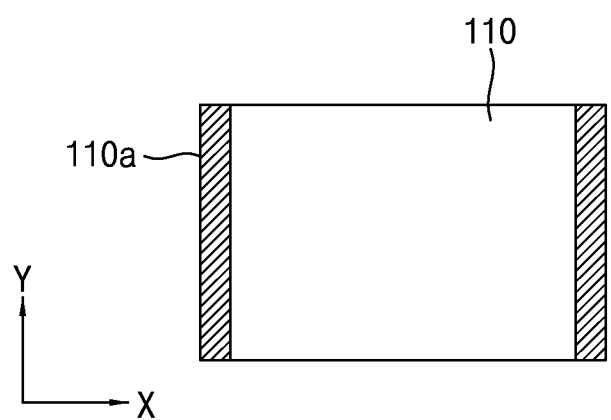

Referring to FIG. 7C, both edge portions 110 of the first memory die D1 about the X-axis may be removed by a desired (and/or alternatively predetermined) thickness to form first cavities 110a. That is, the first cavities 110a may be formed by wholly removing both of the X-axial edge portions 110 of the first memory die D1. A direction in which the first cavity 110a is formed in the first memory die D1 may vary according to a direction in which an under-fill material 140a is deposited. When the under-fill material 140a is deposited in an X-axial direction of the first memory die D1, the first cavities 110a may be formed by removing both of the edge portions 110 of the first memory die D1 about the X-axis.

Figure 7D:
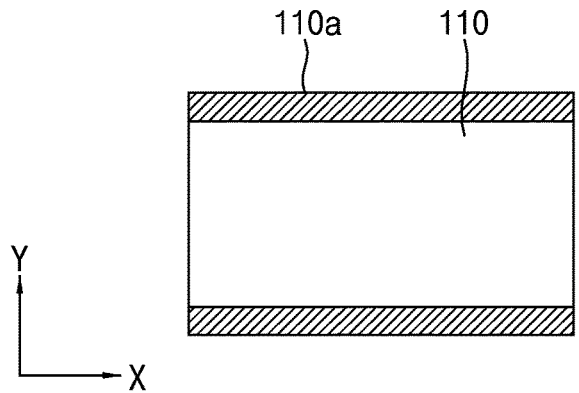

Referring to FIG. 7D, both edge portions 110 of the first memory die D1 about the Y-axis may be removed by a desired (and/or alternatively predetermined) thickness to form the first cavities 110a. That is, the first cavities 110a may be formed by removing both of the edge portions 110 of the first memory die D1 about the Y-axis.

A direction in which the first cavity 110a is formed in the first memory die D1 may vary according to a direction in which the under-fill material 140a is deposited. When the under-fill material 140a is deposited in a Y-axial direction of the first memory die D1, both of the Y-axial edge portions 110 of the first memory die D1 may be removed to form the first cavities 110a.

Figure 7E:
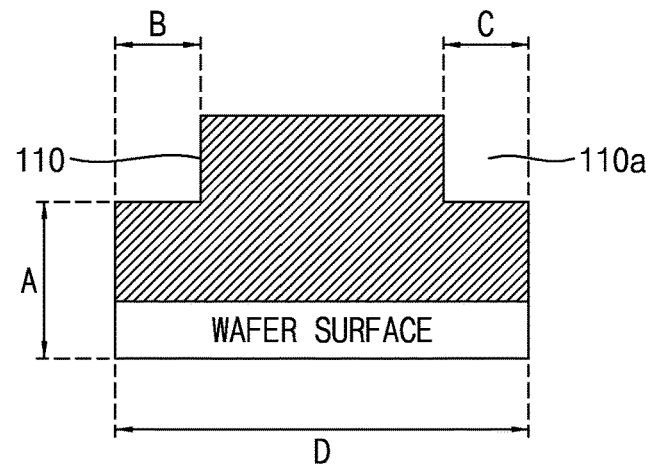
Figure 8:
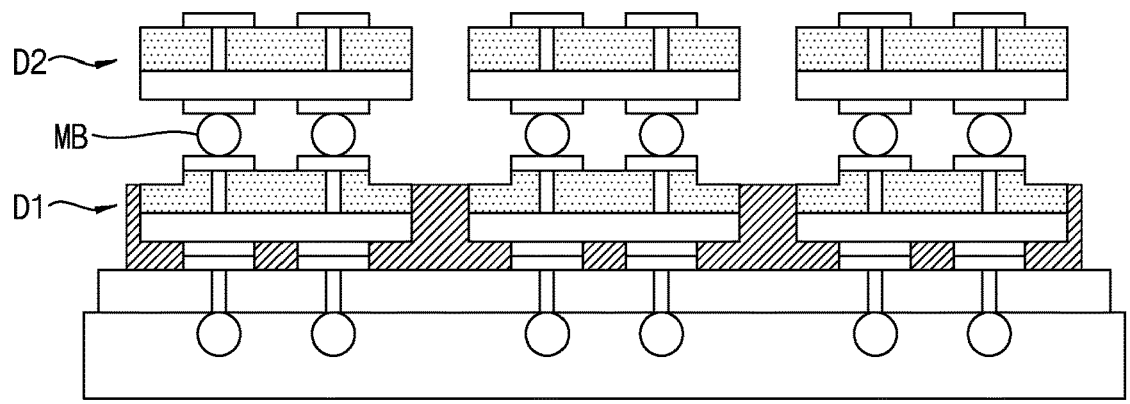

Referring to FIG. 7E, the edge portion 110 of the first memory die D1 may be removed to obtain a thickness A of about 5 μm or more from a surface of the wafer. That is, even when the first cavity 110a is formed by removing the edge portion 110 of the first memory die D1, the edge portion 110 of the first memory die D1 may be formed to have the thickness A of about 5 μm or more from the surface of the wafer.

A sum of widths B and C by which the edge portions 110 of the first memory die D1 are removed may be adjusted to less than half of a width D of the first memory die D1 (B+C<D/2).

When the first cavities 110a are formed by controlling edge portions 110 of four surfaces of the first memory die D1, a sum of widths by which both X-axial edge portions 110 of the first memory die D1 are removed may be adjusted to less than half of the width D of the first memory die D1 (B+C<D/2). That is, a sum of widths of the first cavities 110a formed at both of the X-axial edge portions 110 of the first memory die D1 may be adjusted to less than half of the width D of the first memory die D1 (B+C<D/2). A sum of widths by which both Y-axial edge portions 110 of the first memory die D1 are removed may be adjusted to less than half of the width D of the first memory die D1 (B+C<D/2). That is, a sum of widths of the first cavities 110a formed at both of the Y-axial edge portions 110 of the first memory die D1 may be adjusted to less than half of the width D of the first memory die D1 (B+C<D/2).

When the first cavities 110a are formed by removing both of the X-axial edge portions 110 of the first memory die D1, the sum of the widths by which both of the X-axial edge portions 110 of the first memory die D1 are removed may be adjusted to less than half of the width D of the first memory die D1 (B+C</2). That is, the sum of the widths of the first cavities 110a formed at both of the X-axial edge portions 110 of the first memory die D1 may be adjusted to less than half of the width D of the first memory die D1 (B+C<D/2).

When the first cavities 110a are formed by removing both of the Y-axial edge portions 110 of the first memory die D1, the sum of the widths by which both of the Y-axial edge portions 110 of the first memory die D1 are removed may be adjusted to less than half of the width D of the first memory die D1 (B+C<D/2). That is, the sum of the widths of the first cavities 110a formed at both of the Y-axial edge portions 110 of the first memory die D1 may be adjusted to less than half of the width D of the first memory die D1 (B+C<D/2).

Thereafter, a second memory die D2 may be formed on each of the plurality of first memory dies D1.

A plurality of micro-bumps MB may be disposed between the first memory die D1 and the second memory die D2. TSVs of the first memory die D1 may be connected to TSVs of the second memory die D2 by the micro-bumps MB.

Figure 9:
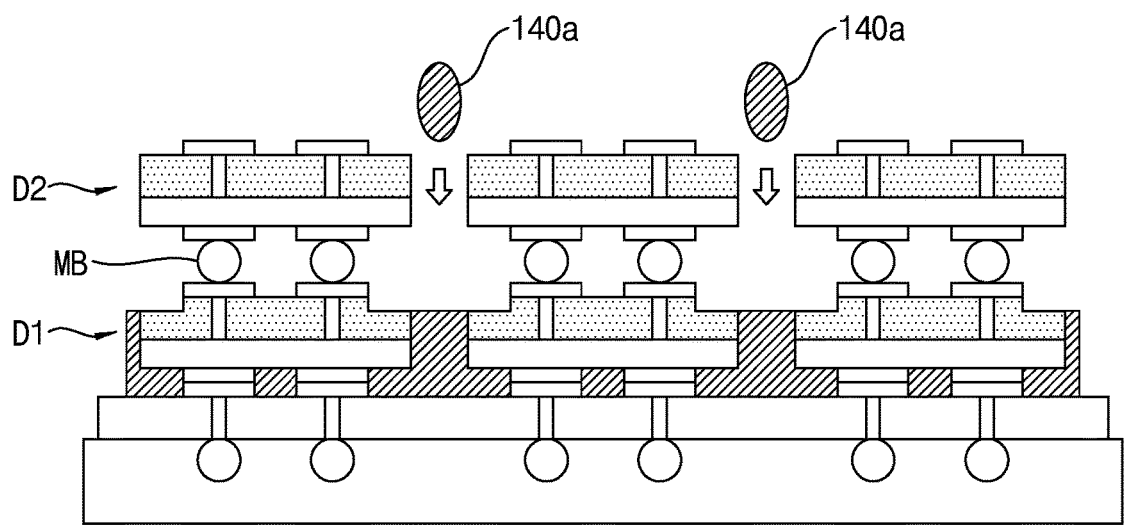

Subsequently, referring to FIG. 9, an under-fill material 140a may be deposited along a scribe lane SL on the wafer on which the second memory die D2 is disposed.

Figure 10:
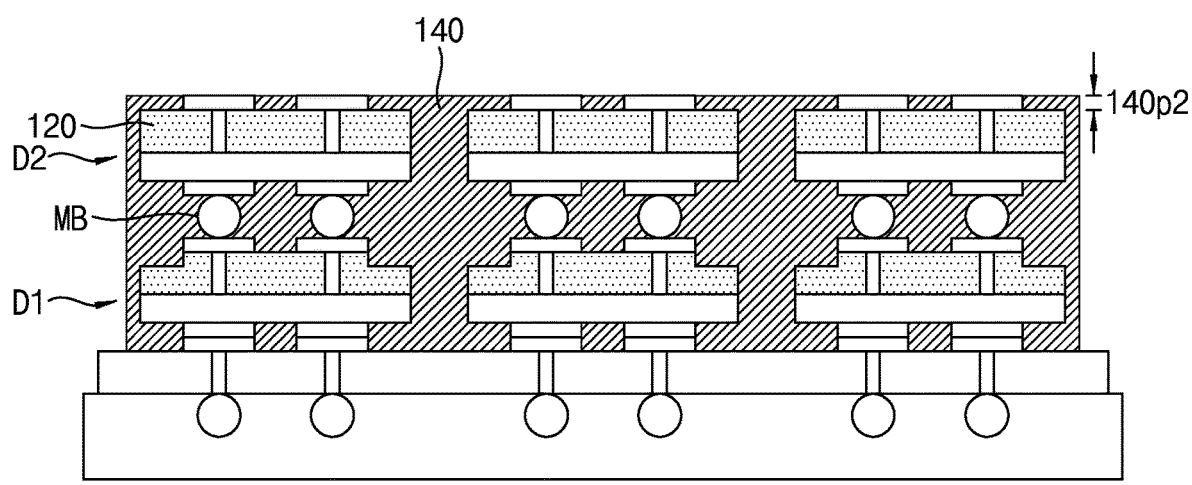

Thereafter, referring to FIG. 10, the under-fill material 140a deposited on the wafer may be sintered to form an under-fill layer 140. In this case, part of the under-fill material 140a may overflow on a top surface of the second memory die D2. When the under-fill layer 140 remains on the top surface of the second memory die D2, the remaining under-fill layer 140 may hinder a subsequent process of stacking the third memory die D3. The remaining under-fill layer 140 on the top surface of the second memory die D2 may be referred to as a second portion 140p2 of the under-fill layer 140.

Figure 11:
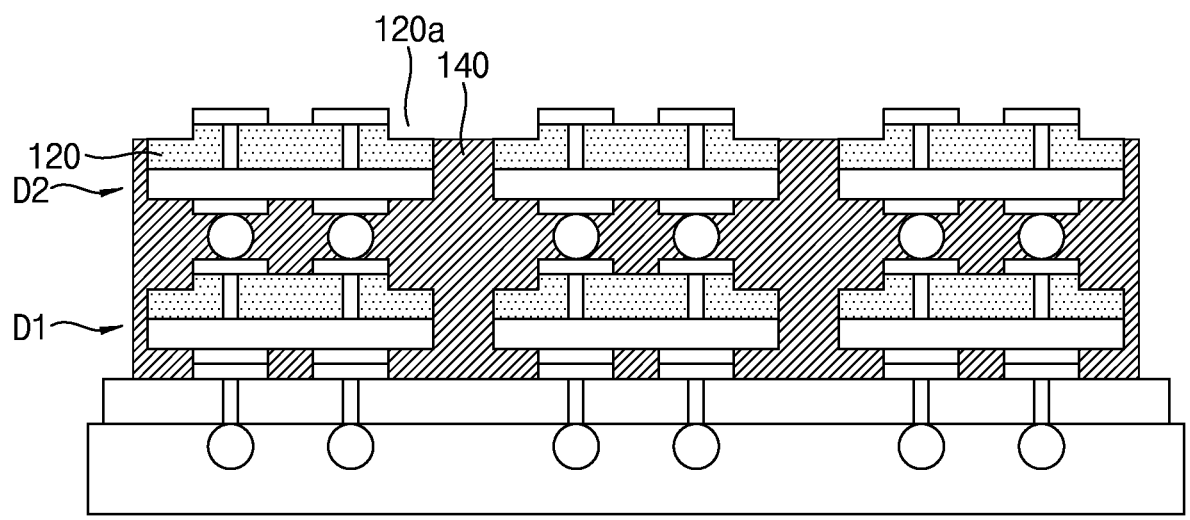

Subsequently, referring to FIG. 11, the second portion 140p2 of the under-fill layer 140 remaining on the top surface of the second memory die D2 may be removed by performing a half sawing process. In this case, during the removal of the under-fill layer 140, the edge portion 120 of the second memory die D2 may be removed by a desired (and/or alternatively predetermined) thickness together with the under-fill layer 140. The edge portion 120 of the second memory die D2 may be removed by a desired (and/or alternatively predetermined) thickness to form a second cavity 120a.

By using the same method as in FIG. 7B, the edge portions 120 of four surfaces of the second memory die D2 may be removed by a desired (and/or alternatively predetermined) thickness to form the second cavities 120a. That is, the second cavities 120a may be formed by removing both X-axial edge portions 120 and both Y-axial edge portions 120 of the second memory die D2.

By using the same method as in FIG. 7C, both of the X-axial edge portions 120 of the second memory die D2 may be removed by a desired (and/or alternatively predetermined) thickness to form the second cavities 120a. That is, both of the X-axial edge portions 120 of the second memory die D2 may be wholly removed to form the second cavities 120a.

By using the same method as in FIG. 7D, both of the Y-axial edge portions 120 of the second memory die D2 may be removed by a desired (and/or alternatively predetermined) thickness to form the second cavities 120a. That is, the second cavities 120a may be formed by wholly removing both of the Y-axial edge portions 120 of the second memory die D2.

By using the same method as in FIG. 7E, the edge portion 120 of the second memory die D2 may be removed so that the edge portion 120 of the second memory die D2 at which the second cavity 120a is formed may obtain a thickness of about 5 μm or more. That is, even when the second cavity 120a is formed by removing the edge portion 120 of the second memory die D2, a thickness A of the edge portion 120 of the second memory die D2 may be adjusted to about 5 μm or more.

A sum of widths B and C by which the edge portions 120 of the second memory die D2 are removed may be adjusted to less than half of a width D of the second memory die D2 (B+C<D/2).

When the second cavities 120a are formed by controlling edge portions 120 of four surfaces of the second memory die D2, a sum of widths by which both X-axial edge portions 120 of the second memory die D2 are removed may be adjusted to less than half of the width D of the second memory die D2 (B+C<D/2). A sum of widths by which both Y-axial edge portions 120 of the second memory die D2 are removed may be adjusted to less than half of the width D of the second memory die D2 (B+C<D/2).

When the second cavities 120a are formed by removing both of the X-axial edge portions 120 of the second memory die D2, the sum of the widths by which both X-axial edge portions 120 of the second memory die D2 are removed may be adjusted to less than half of the width D of the second memory die D2 (B+C<D/2).

When the second cavities 120a are formed by removing both of the Y-axial edge portions 120 of the second memory die D2, the sum of the widths by which both Y-axial edge portions 120 of the second memory die D2 are removed may be adjusted to less than half of the width D of the second memory die D2 (B+C<D/2).

Figure 12:
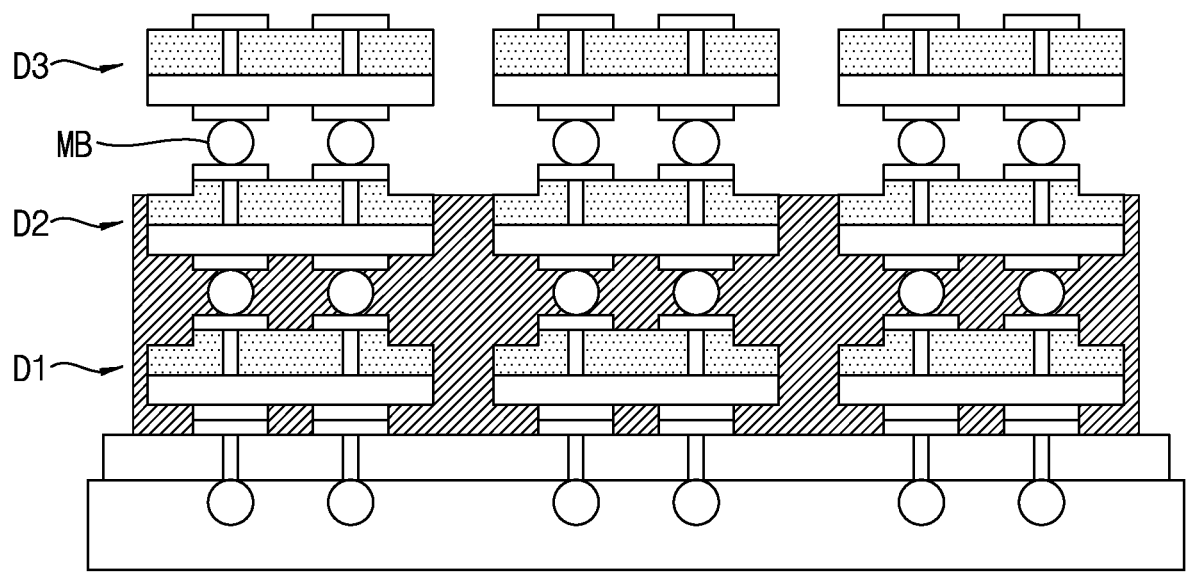

Thereafter, referring to FIG. 12, a third memory die D3 may be formed on each of a plurality of second memory dies D2.

A plurality of micro-bumps MB may be disposed between the second memory die D2 and the third memory die D3. The TSVs of the second memory die D2 may be connected to TSVs of the third memory die D3 by the micro-bumps MB.

Figure 13:
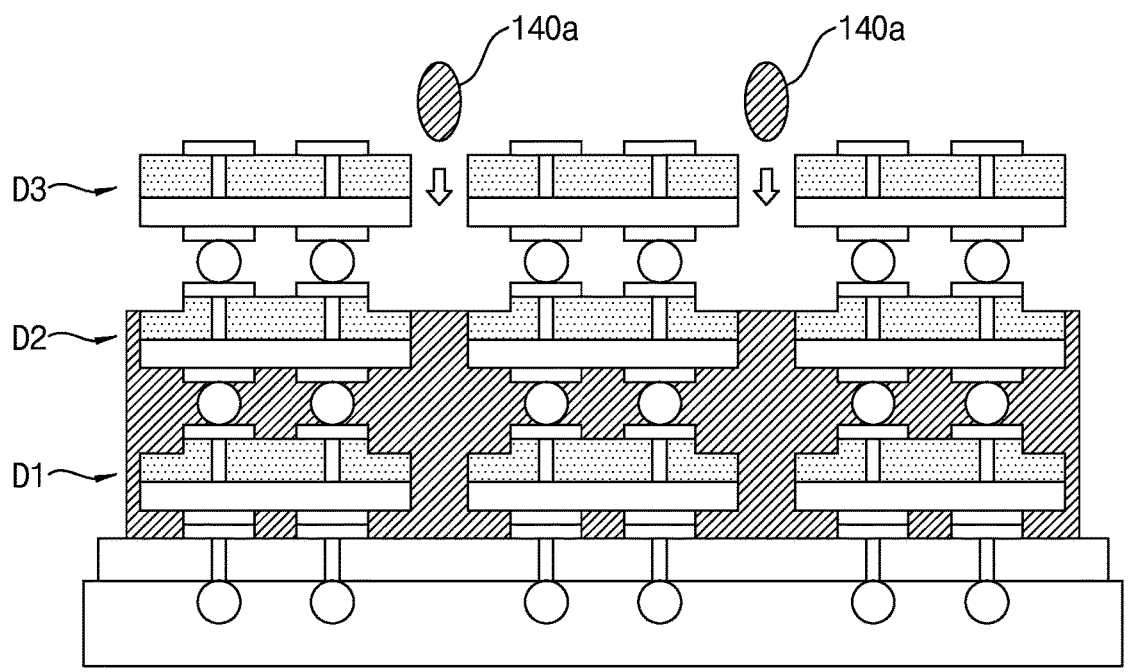

Thereafter, referring to FIG. 13, an under-fill material 140a may be deposited along a scribe lane SL on the wafer on which the third memory die D3 is disposed.

Figure 14:
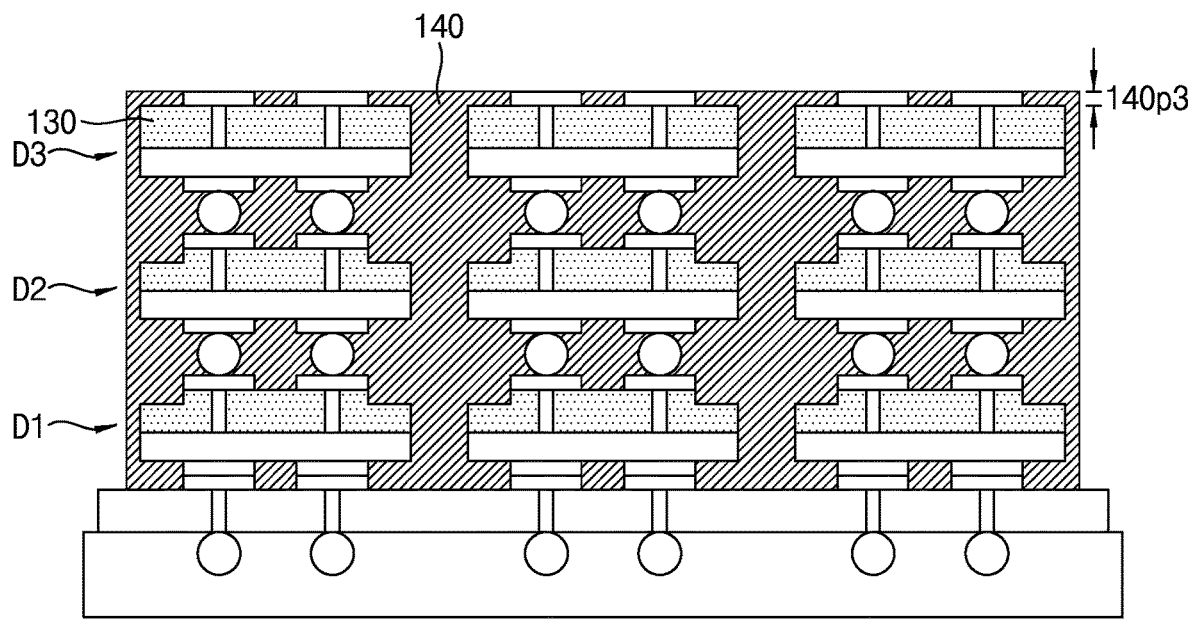

Subsequently, referring to FIG. 14, the under-fill material 140a deposited on the wafer may be sintered to form an under-fill layer 140. In this case, part of the under-fill material 140a may overflow on a top surface of the third memory die D3. When the under-fill layer 140 remains on the top surface of the third memory die D3, the remaining under-fill layer 140 may hinder a subsequent process of stacking the fourth memory die D4. The remaining under-fill layer 140 on the top surface of the second memory die D3 may be referred to as a third portion 140p3 of the under-fill layer 140.

Figure 15:
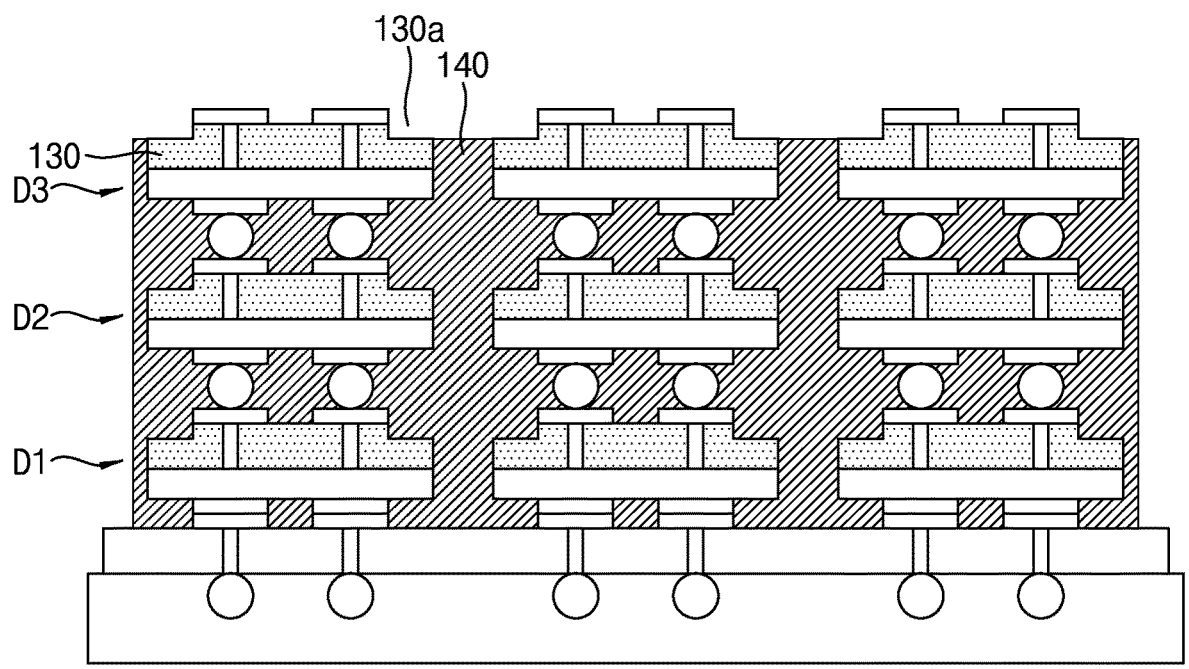

Next, referring to FIG. 15, the third portion 140p3 of the under-fill layer 140 remaining on the top surface of the third memory die D3 may be removed by performing a half sawing process. In this case, during the removal of the under-fill layer 140, the edge portion 130 of the third memory die D3 may be removed by a desired (and/or alternatively predetermined) thickness together with the under-fill layer 140. The edge portion 130 of the third memory die D3 may be removed by a desired (and/or alternatively predetermined) thickness to form a third cavity 130a.

By using the same method as in FIG. 7B, edge portions 130 of four surfaces of the third memory die D3 may be removed by a desired (and/or alternatively predetermined) thickness to form the third cavities 130a. That is, the third cavities 130a may be formed by wholly removing both X-axial edge portions 130 and both Y-axial edge portions 130 of the third memory die D3.

By using the same method as in FIG. 7C, both of the edge portions 130 of the third memory die D3 about the X-axis may be removed by a desired (and/or alternatively predetermined) thickness to form the third cavities 130a. That is, the third cavities 130a may be formed by removing both of the X-axial edge portions 130 of the third memory die D3.

By using the same method as in FIG. 7D, both of the edge portions 130 of the third memory die D3 about the Y-axis may be removed by a desired (and/or alternatively predetermined) thickness to form the third cavities 130a. That is, the third cavities 130a may be formed by removing both of the edge portions 130 of the third memory die D3 about the Y-axis.

By using the same method as in FIG. 7E, the edge portion 130 of the third memory die D3 may be removed so that the edge portion 130 of the third memory die D3 at which the third cavity 130a is formed may obtain a thickness of about 5 μm or more. That is, even when the third cavity 130a is formed by removing the edge portion 130 of the third memory die D3, a thickness A of the edge portion 130 of the third memory die D3 may be adjusted to about 5 μm or more.

A sum of widths B and C by which the edge portions 130 of the third memory die D3 are removed may be adjusted to less than half of a width D of the third memory die D3 (B+C<D/2).

When the third cavities 130a are formed by controlling edge portions 130 of four surfaces of the third memory die D3, a sum of widths by which both X-axial edge portions 130 of the third memory die D3 are removed may be adjusted to less than half of the width D of the third memory die D3 (B+C<D/2). A sum of widths by which both Y-axial edge portions 130 of the third memory die D3 are removed may be adjusted to less than half of the width D of the third memory die D3 (B+C<D/2).

When the third cavities 130a are formed by removing both of the X-axial edge portions 130 of the third memory die D3, the sum of the widths by which both X-axial edge portions 130 of the third memory die D3 are removed may be adjusted to less than half of the width D of the third memory die D3 (B+C<D/2).

When the third cavities 130a are formed by removing both of the Y-axial edge portions 130 of the third memory die D3, the sum of the widths by which both Y-axial edge portions 130 of the third memory die D3 are removed may be adjusted to less than half of the width D of the third memory die D3 (B+C<D/2).

Figure 16:
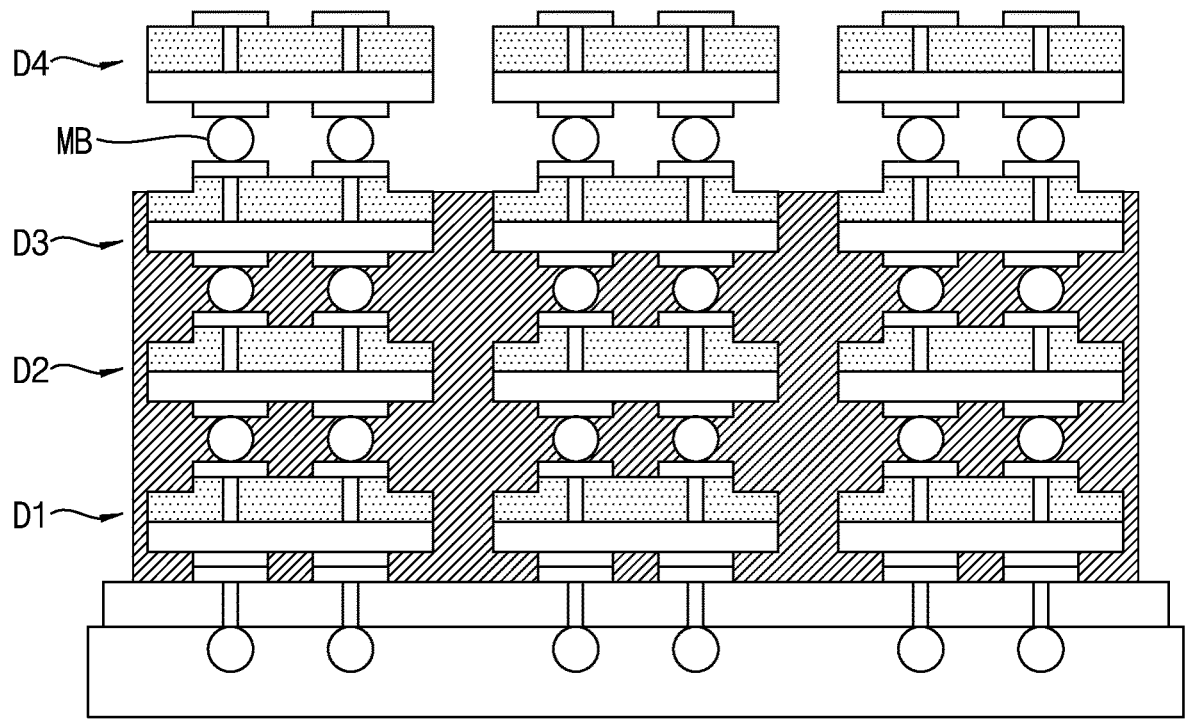

Next, referring to FIG. 16, a fourth memory die D4 may be formed on each of the plurality of third memory dies D3.

A plurality of micro-bumps MB may be disposed between the third memory die D3 and the fourth memory die D4. The TSVs of the third memory die D3 may be connected to TSVs of the fourth memory die D4 by the micro-bumps MB.

Figure 17:
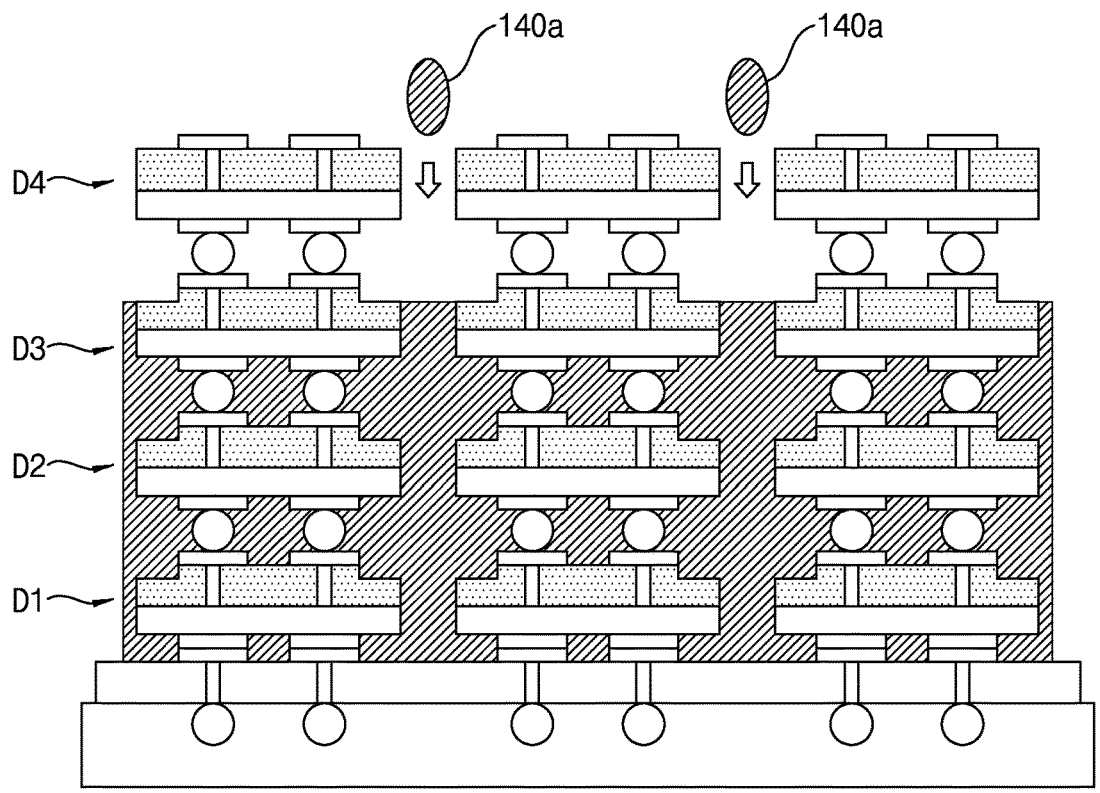

Thereafter, referring to FIG. 17, an under-fill material 140a may be deposited along a scribe lane SL on the wafer on which the fourth memory die D4 is disposed.

Figure 18:
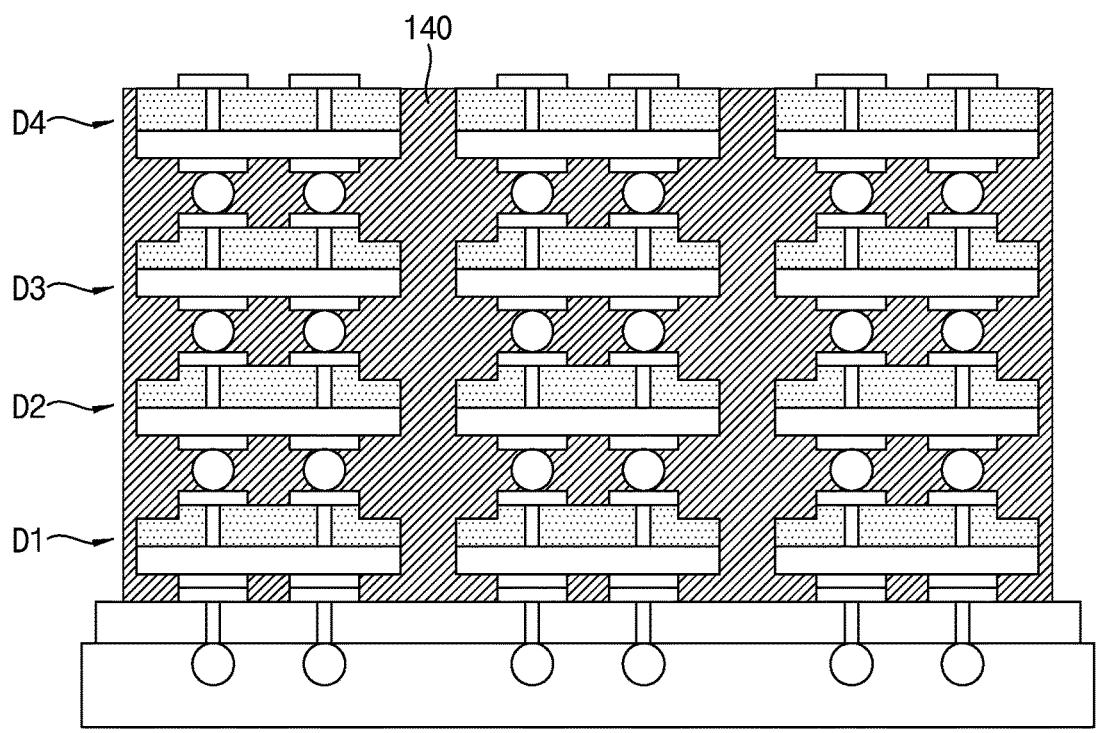

Subsequently, referring to FIG. 18, the under-fill material 140a deposited on the wafer may be sintered to form an under-fill layer 140. In this case, part of the under-fill material 140a may overflow on a top surface of the fourth memory die D4. The under-fill layer 140 remaining on the top surface of the fourth memory die D4 may be removed by performing a half sawing process.

Prior to a scribing process, an electromagnetic compatibility (EMC) layer may be formed to protect the semiconductor memory apparatus 100 from electromagnetic interference (EMC). Subsequently, the scribing process may be performed to cut the wafer into individual chip package units.

In the method of manufacturing the semiconductor memory apparatus according to some embodiments of inventive concepts, since an interposer is not disposed, it may be unnecessary to apply an interposer wafer during a manufacturing process. Accordingly, one wafer may be saved during the manufacturing of the semiconductor memory apparatus 100 and thus, manufacturing costs may be reduced. In addition, since memory die stacks may be disposed adjacent to each other, a distance between scribe lanes may be reduced, and more semiconductor memory apparatuses 100 may be manufactured using one wafer.

FIGS. 19 to 29 are views illustrating a method of manufacturing a semiconductor memory apparatus according to an embodiment of inventive concepts.

Figure 19:
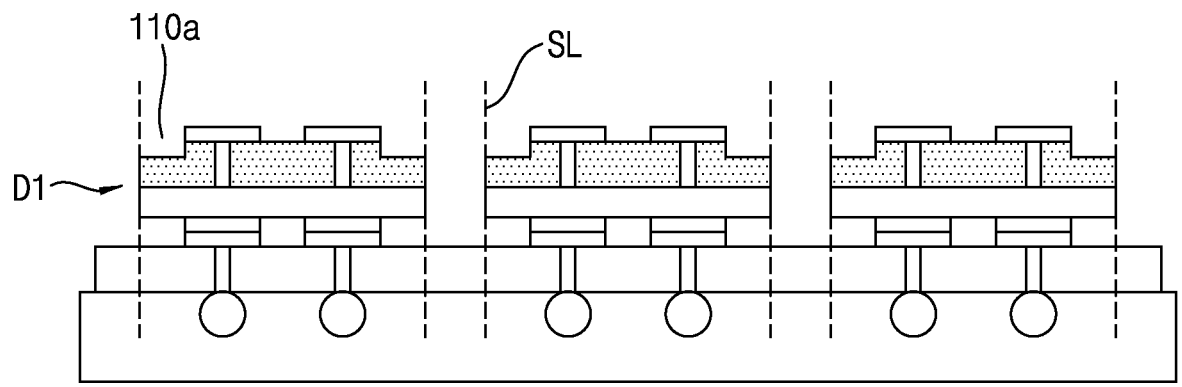
FIGS. 19 to 29 are views illustrating a method of manufacturing a semiconductor memory apparatus according to an embodiment of inventive concepts.

Referring to FIG. 19, a plurality of first memory dies D1 may be formed on a wafer. After the stacking of the memory dies D1 to D4 is completed, the plurality of first memory dies D1 may be disposed a desired (and/or alternatively predetermined) distance apart from each other to enable a scribing process.

Figure 20:
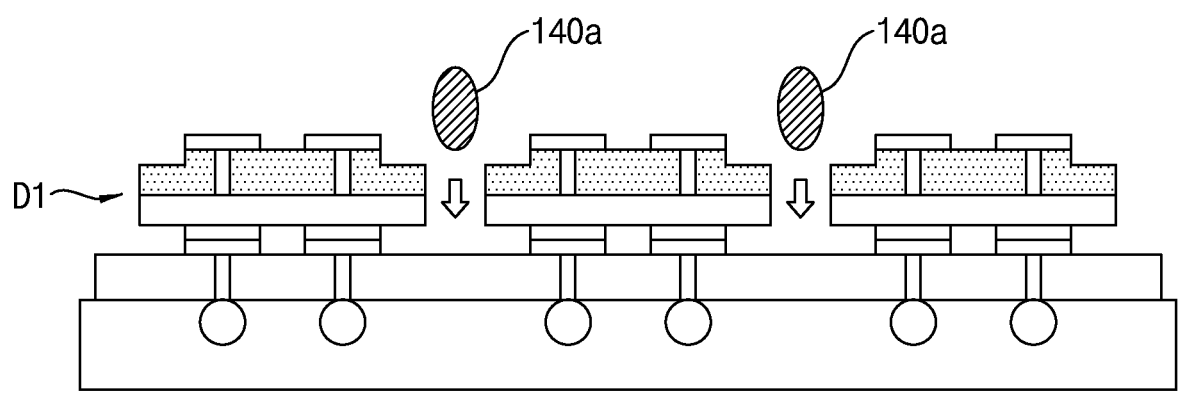

Thereafter, referring to FIG. 20, the edge portion 110 of the first memory die D1 may be partially removed so that part of the under-fill material 140a may be inhibited from overflowing on the top surface of the first memory die D1. As an example, the edge portion 110 of the first memory die D1 may be removed by a desired (and/or alternatively predetermined) thickness by performing a half sawing process to form a first cavity 110a.

As in FIG. 7B, the edge portions 110 of four surfaces of the first memory die D1 may be remove by a desired (and/or alternatively predetermined) thickness to form the first cavities 110a. That is, the first cavities 110a may be formed by wholly removing both X-axial edge portions 110 and both Y-axial edge portions 110 of the first memory die D1.

As in FIG. 7C, both edge portions 110 of the first memory die D1 about an X-axis may be removed by a desired (and/or alternatively predetermined) thickness to form the first cavities 110a. That is, the first cavities 110a may be formed by wholly removing both of the X-axial edge portions 110 of the first memory die D1.

As in FIG. 7D, both edge portions 110 of the first memory die D1 about a Y-axis may be removed by a desired (and/or alternatively predetermined) thickness to form the first cavities 110a. That is, the first cavities 110a may be formed by wholly removing both of the Y-axial edge portions 110 of the first memory die D1.

As in FIG. 7E, the edge portion 110 of the first memory die D1 may be removed to have a thickness A of about 5 μm or more from the surface of the wafer. That is, even when the first cavity 110a is formed by removing the edge portion 110 of the first memory die D1, the thickness A of the edge portion 110 of the first memory die D1 from the surface of the wafer may be adjusted to about 5 μm or more.

A sum of widths B and C by which the edge portions 110 of the first memory die D1 are removed may be adjusted to less than half of a width D of the first memory die D1 (B+C<D/2).

When the first cavities 110a are formed by controlling edge portions 110 of four surfaces of the first memory die D1, a sum of widths by which both X-axial edge portions 110 of the first memory die D1 are removed may be adjusted to less than half of the width D of the first memory die D1 (B+C<D/2). That is, a sum of widths of the first cavities 110a formed at both of the X-axial edge portions 110 of the first memory die D1 may be adjusted to less than half of the width D of the first memory die D1 (B+C<D/2). A sum of widths by which both Y-axial edge portions 110 of the first memory die D1 are removed may be adjusted to less than half of the width D of the first memory die D1 (B+C<D/2). That is, a sum of widths of the first cavities 110a formed at both of the Y-axial edge portions 110 of the first memory die D1 may be adjusted to less than half of the width D of the first memory die D1 (B+C<D/2).

When the first cavities 110a are formed by removing both of the X-axial edge portions 110 of the first memory die D1, the sum of the widths by which both of the X-axial edge portions 110 of the first memory die D1 are removed may be adjusted to less than half of the width D of the first memory die D1 (B+C<D/2). That is, the sum of widths of the first cavities 110a formed at both of the X-axial edge portions 110 of the first memory die D1 may be adjusted to less than half of the width D of the first memory die D1 (B+C<D/2).

When the first cavities 110a are formed by removing both of the Y-axial edge portions 110 of the first memory die D1, the sum of the widths by which both of the Y-axial edge portions 110 of the first memory die D1 are removed may be adjusted to less than half of the width D of the first memory die D1 (B+C<D/2). That is, the sum of widths of the first cavities 110a formed at both of the Y-axial edge portions 110 of the first memory die D1 may be adjusted to less than half of the width D of the first memory die D1 (B+C<D/2).

Figure 21:
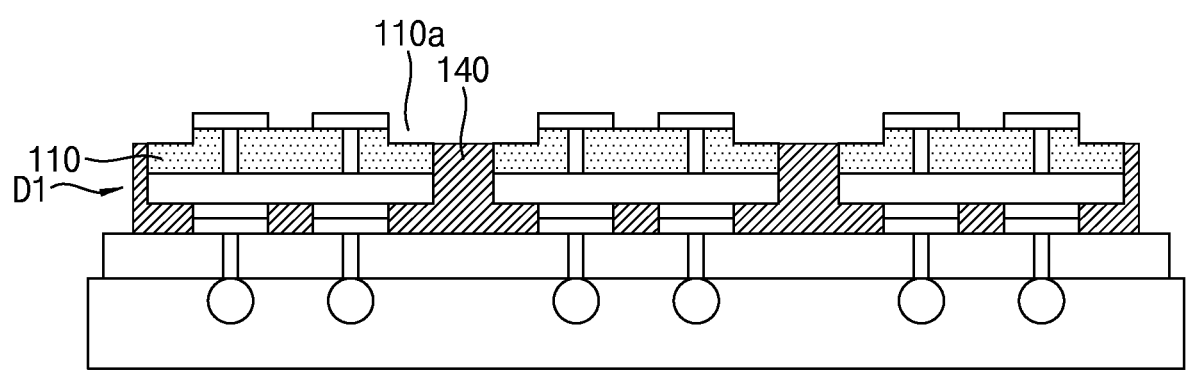

Subsequently, referring to FIG. 21, an under-fill material 140a may be along a scribe lane SL on the wafer on which the first memory die D1 is disposed. The under-fill material 140a deposited on the wafer may be sintered to form an under-fill layer 140. Prior to forming the under-fill layer 140, the edge portion 110 of the first memory die D1 may be removed by a desired (and/or alternatively predetermined) thickness so that the under-fill layer 140 may be inhibited from remaining on the top surface of the first memory die D1.

Figure 22:
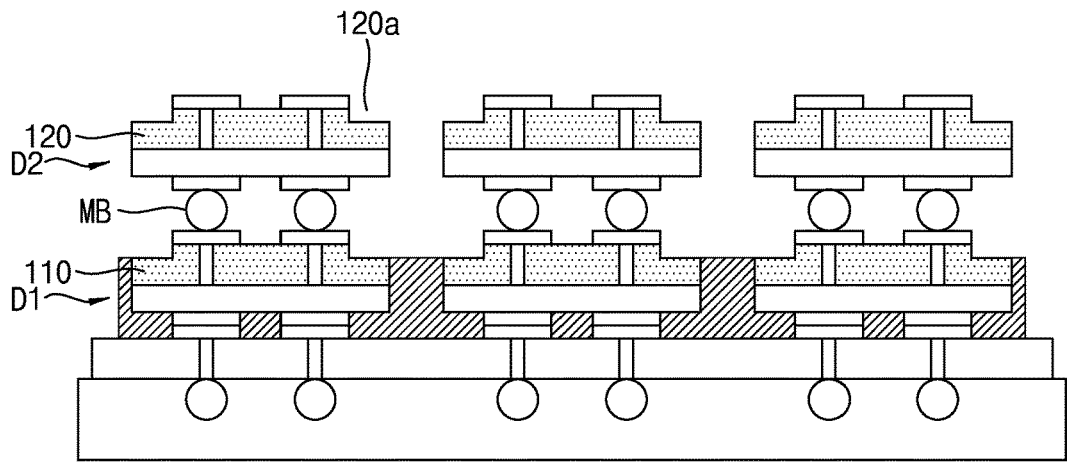

Thereafter, referring to FIG. 22, a second memory die D2 may be formed on each of the plurality of first memory dies D1. A plurality of micro-bumps M may be disposed between the first memory die D1 and the second memory die D2. TSVs of the first memory die D1 may be connected to TSVs of the second memory die D2 by the micro-bumps MB.

The edge portion 120 of the second memory die D2 may be partially removed so that part of the under-fill material 140a may be inhibited from overflowing on the top surface of the second memory die D2. As an example, the edge portion 120 of the second memory die D2 may be removed by a desired (and/or alternatively predetermined) thickness by performing a half sawing process to form a second cavity 120a.

As in FIG. 7B, the edge portions 120 of four surfaces of the second memory die D2 may be removed by a desired (and/or alternatively predetermined) thickness to form the second cavities 120a. That is, the second cavities 120a may be formed by wholly removing both of the X-axial edge portions 120 and both Y-axial edge portions 120 of the second memory die D2.

As in FIG. 7C, both of the edge portions 120 of the second memory die D2 about the X-axis may be removed by a desired (and/or alternatively predetermined) thickness to form the second cavities 120a. That is, the second cavities 120a may be formed by wholly removing both of the edge portions 120 of the second memory die D2 about the X-axis.

As in FIG. 7D, both of the edge portions 120 of the second memory die D2 about the Y-axis may be removed by a desired (and/or alternatively predetermined) thickness to form the second cavities 120a. That is, the second cavities 120a may be formed by wholly removing both of the Y-axial edge portions 120 of the second memory die D2.

As in FIG. 7E, the edge portion 120 of the second memory die D2 may be removed so that the edge portion 110 of the second memory die D2 at which the second cavity 120a is formed may have a thickness A of about 5 μm or more. That is, even when the second cavity 120a is formed by removing the edge portion 120 of the second memory die D2, the thickness A of the edge portion 120 of the second memory die D2 may be adjusted to about 5 μm or more.

A sum of widths B and C by which the edge portions 120 of the second memory die D2 are removed may be adjusted to less than half of a width D of the second memory die D2 (B+C<D/2).

When the second cavities 120a are formed by controlling edge portions 120 of four surfaces of the second memory die D2, a sum of widths by which both X-axial edge portions 120 of the second memory die D2 are removed may be adjusted to less than half of the width D of the second memory die D2 (B+C<D/2). A sum of widths by which both Y-axial edge portions 120 of the second memory die D2 are removed may be adjusted to less than half of the width D of the second memory die D2 (B+C<D/2).

When the second cavities 120a are formed by removing both of the X-axial edge portions 120 of the second memory die D2, the sum of the widths by which both of the X-axial edge portions 120 of the second memory die D2 are removed may be adjusted to less than half of the width D of the second memory die D2 (B+C<D/2).

When the second cavities 120a are formed by removing both of the Y-axial edge portions 120 of the second memory die D2, the sum of the widths by which both of the Y-axial edge portions 120 of the second memory die D2 are removed may be adjusted to less than half of the width D of the second memory die D1 (B+C<D/2).

Figure 23:
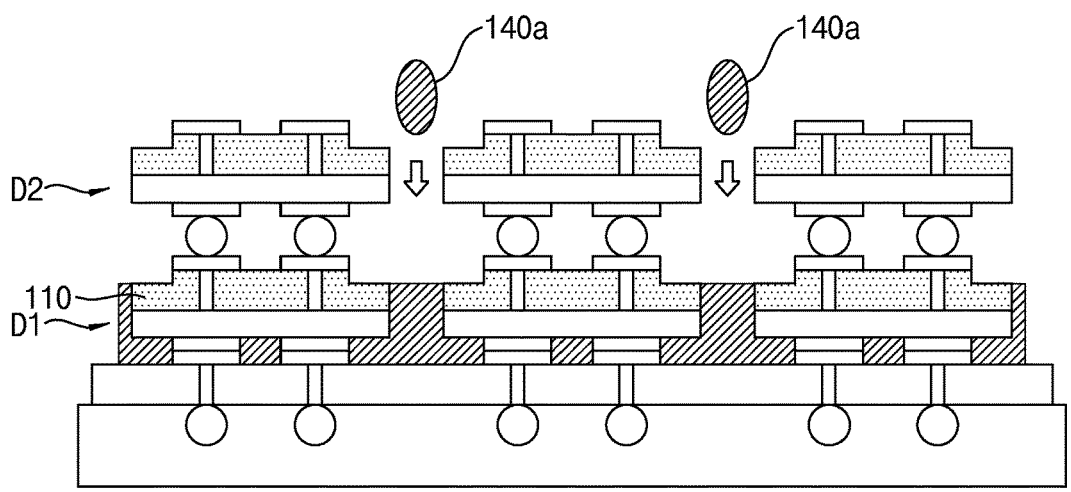

Thereafter, referring to FIG. 23, an under-fill material 140a may be deposited along a scribe lane SL on the wafer on which the second memory die D2 is disposed.

Figure 24:
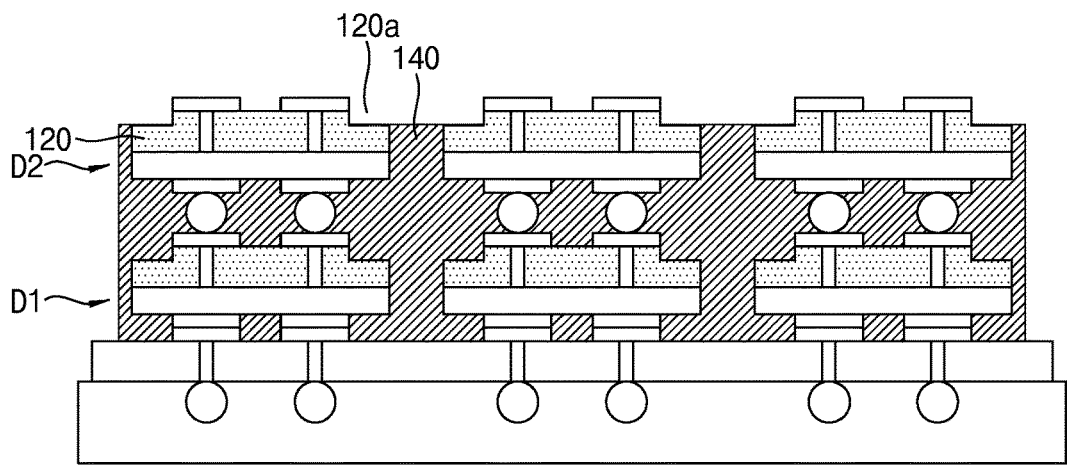

Next, referring to FIG. 24, the under-fill material 140a deposited on the wafer may be sintered to form an under-fill layer 140. Prior to forming the under-fill layer 140, the edge portion 120 of the second memory die D2 may be removed by a desired (and/or alternatively predetermined) thickness so that the under-fill layer 140 may be inhibited from remaining on the top surface of the second memory die D2.

Figure 25:
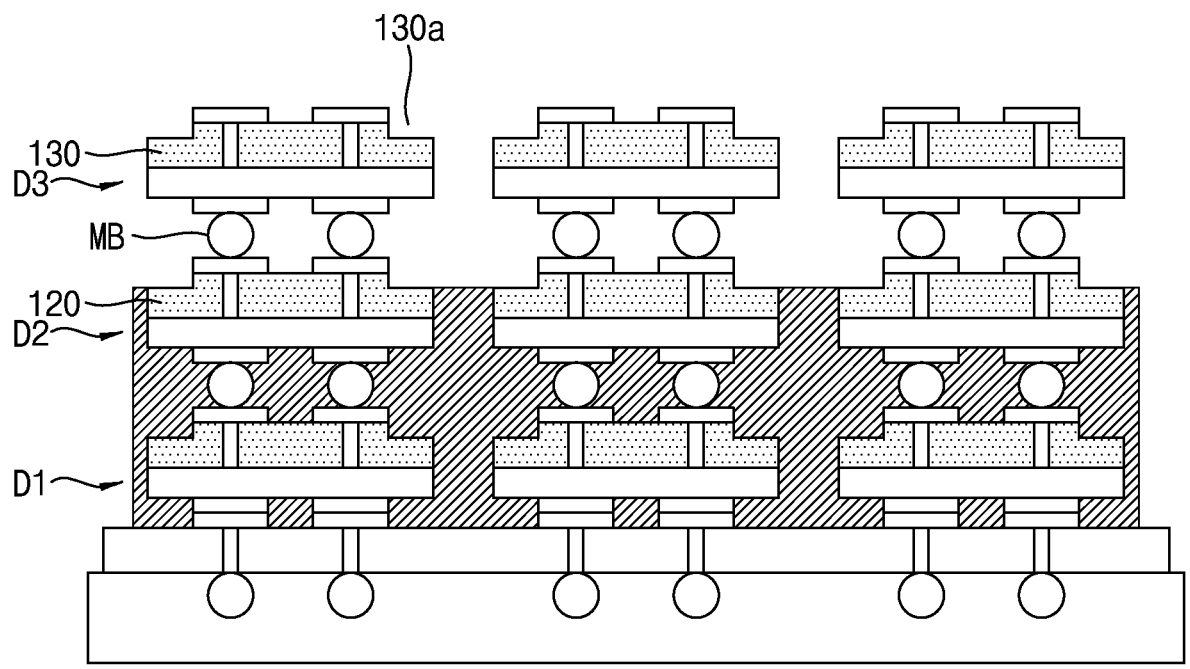

Referring to FIG. 25, a third memory die D3 may be formed on each of the plurality of second memory dies D2. A plurality of micro-bumps MB may be disposed between the second memory die D2 and the third memory die D3. TSVs of the second memory die D2 may be connected to TSVs of the third memory die D3 by the micro-bumps MB.

The edge portion 120 of the second memory die D2 may be partially removed to limit and/or prevent a portion of the under-fill material 140a from overflowing on the top surface of the second memory die D2. As an example, the edge portion 120 of the second memory die D2 may be removed by a desired (and/or alternatively predetermined) thickness using a half sawing process to form the second cavity 120a.

By using the same method as in FIG. 7B, the edge portions 130 of four surfaces of the third memory die D3 may be removed by a desired (and/or alternatively predetermined) thickness to form third cavities 130a. That is, both X-axial edge portions 130 and both Y-axial edge portions 130 of the third memory die D3 may be wholly removed to form the third cavities 130a.

By using the same method as in FIG. 7C, both of the edge portions 130 of the third memory die D3 about the X-axis may be removed by a desired (and/or alternatively predetermined) thickness to form the third cavities 130a. That is, the third cavities 130a may be formed by wholly removing both of the edge portions 130 of the third memory die D3 about the X-axis.

By using the same method as in FIG. 7D, both of the edge portions 130 of the third memory die D3 about the Y-axis may be removed by a desired (and/or alternatively predetermined) thickness to form the third cavities 130a. That is, the third cavities 130a may be formed by wholly removing both of the edge portions 130 of the third memory die D3 about the Y-axis.

By using the same method as in FIG. 7E, the edge portion 130 of the third memory die D3 may be removed so that the edge portion 130 of the third memory die D3 at which the third cavity 130a is formed may obtain a thickness of about 5 μm or more. That is, even when the third cavity 130a is formed by removing the edge portion 130 of the third memory die D3, a thickness A of the edge portion 130 of the third memory die D3 may be adjusted to about 5 μm or more.

A sum of widths B and C by which the edge portions 130 of the third memory die D3 are removed may be adjusted to less than half of a width D of the third memory die D3 (B+C<D/2).

When the third cavities 130a are formed by controlling edge portions 130 of four surfaces of the third memory die D3, a sum of widths by which both X-axial edge portions 130 of the third memory die D3 are removed may be adjusted to less than half of a width D of the third memory die D3 (B+C<D/2). A sum of widths by which both Y-axial edge portions 130 of the third memory die D3 are removed may be adjusted to less than half of the width D of the third memory die D3 (B+C<D/2).

When the third cavities 130a are formed by removing both of the X-axial edge portions 130 of the third memory die D3, the sum of the widths by which both of the X-axial edge portions 130 of the third memory die D3 are removed may be less than half of the width D of the third memory die D3 (B+C<D/2).

When the third cavities 130a are formed by removing both of the Y-axial edge portions 130 of the third memory die D3, the sum of the widths by which both of the Y-axial edge portions 130 of the third memory die D3 are removed may be adjusted to less than half of the width D of the third memory die D3 (B+C<D/2).

Figure 26:
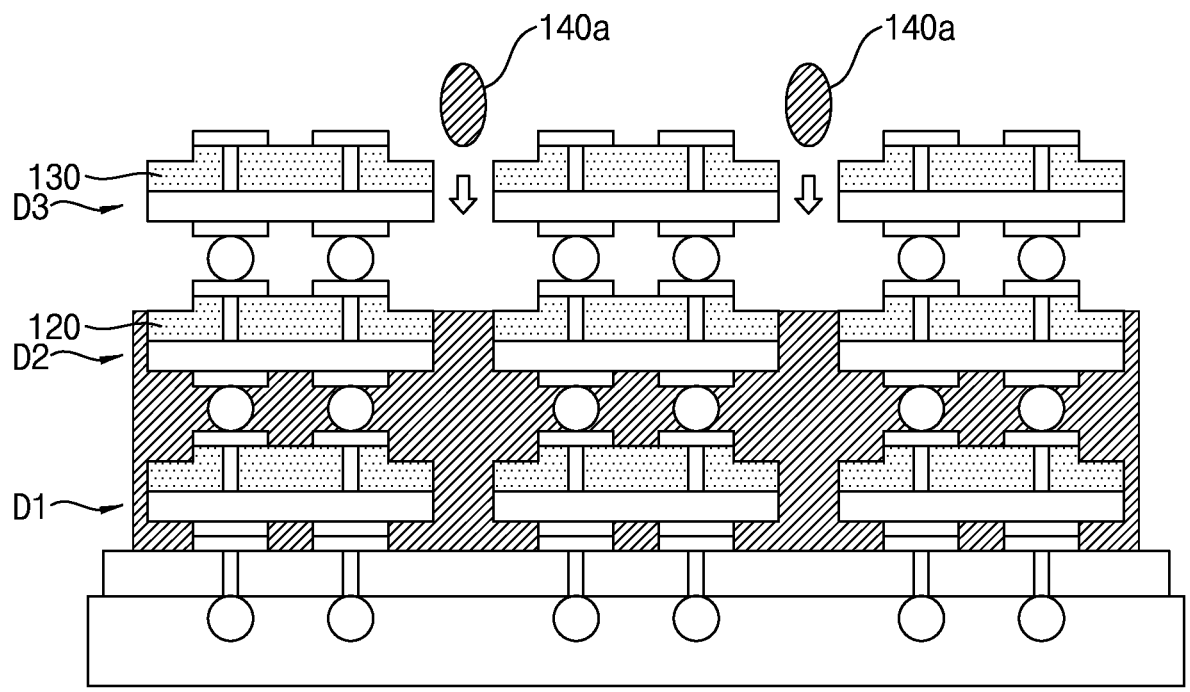

Referring to FIG. 26, an under-fill material 140a may be deposited along a scribe lane SL on the wafer on which the second memory die D2 is disposed.

Figure 27:
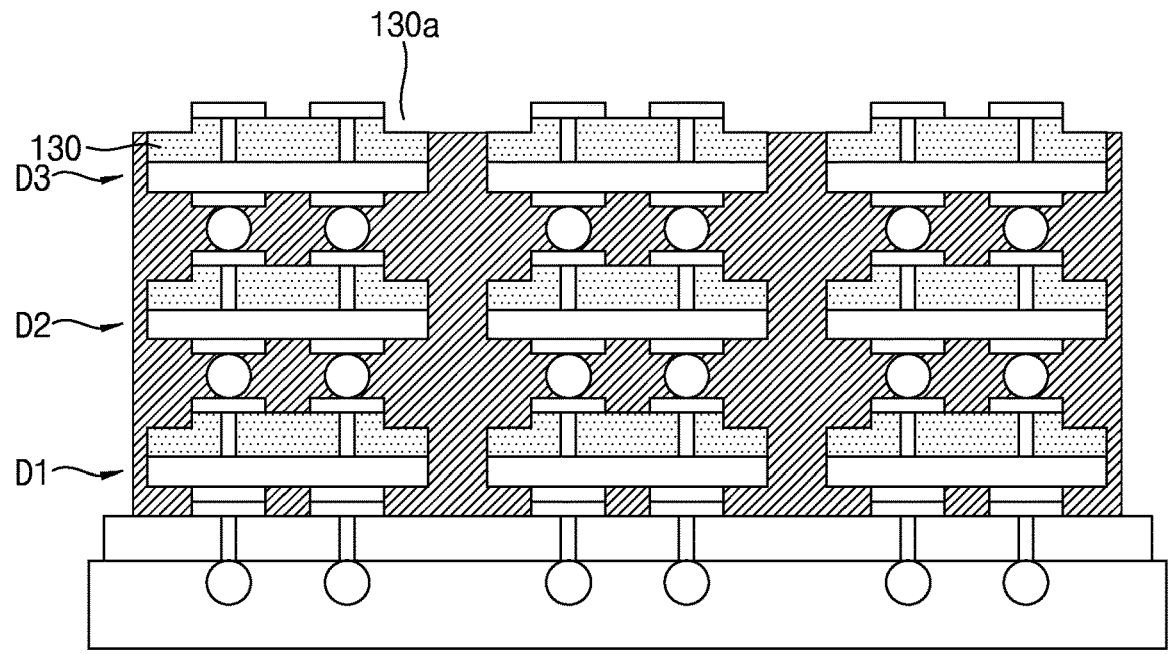

Next, referring to FIG. 27, the under-fill material 140a deposited on the wafer may be sintered to form an under-fill layer 140. Prior to forming the under-fill layer 140, the edge portion 130 of the third memory die D3 may be removed by a desired (and/or alternatively predetermined) thickness so that the under-fill layer 140 may be inhibited from remaining on the top surface of the third memory die D3.

Figure 28:
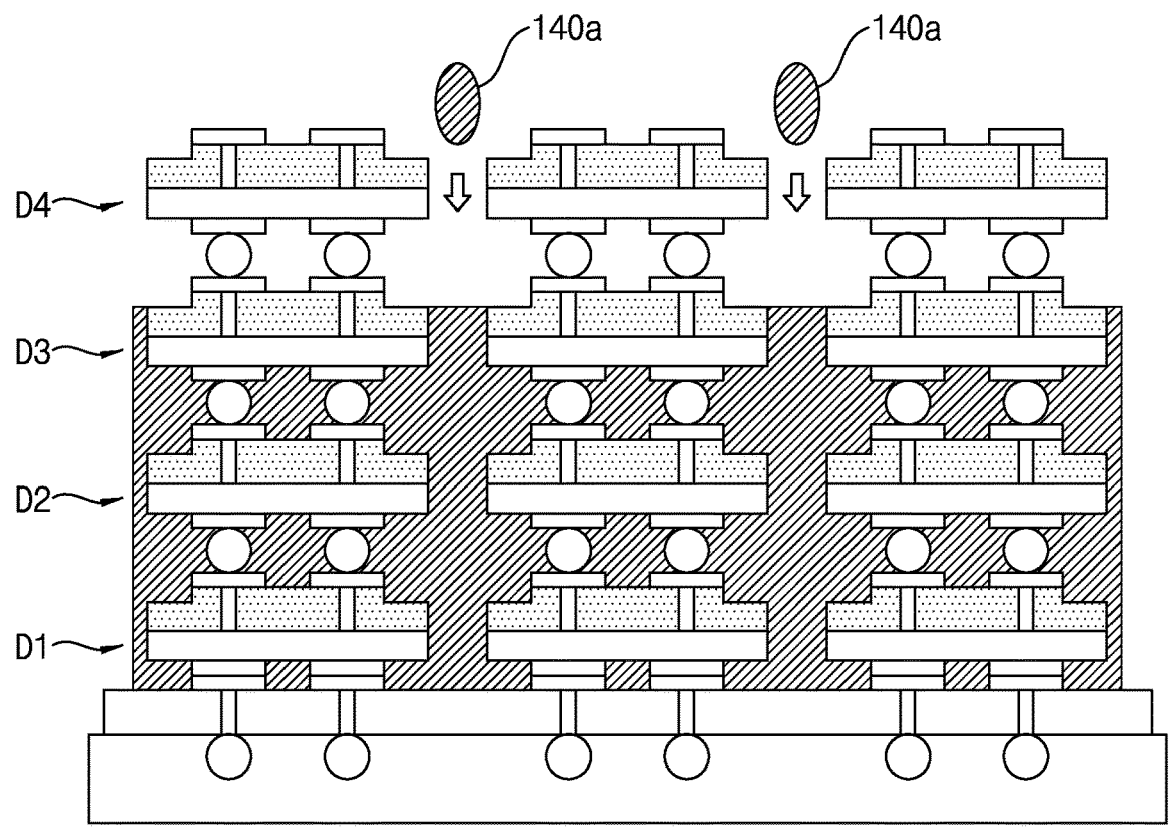

Referring to FIG. 28, a fourth memory die D4 may be formed on each of the plurality of third memory dies D3. A plurality of micro-bumps MB may be disposed between the third memory die D3 and the fourth memory die D4. The TSVs of the third memory die D3 may be connected to TSVs of the fourth memory die D4 may the micro-bumps MB. Thereafter, an under-fill material 140a may be deposited along a scribe lane SL on the wafer on which the second memory die D2 is disposed.

Figure 29:
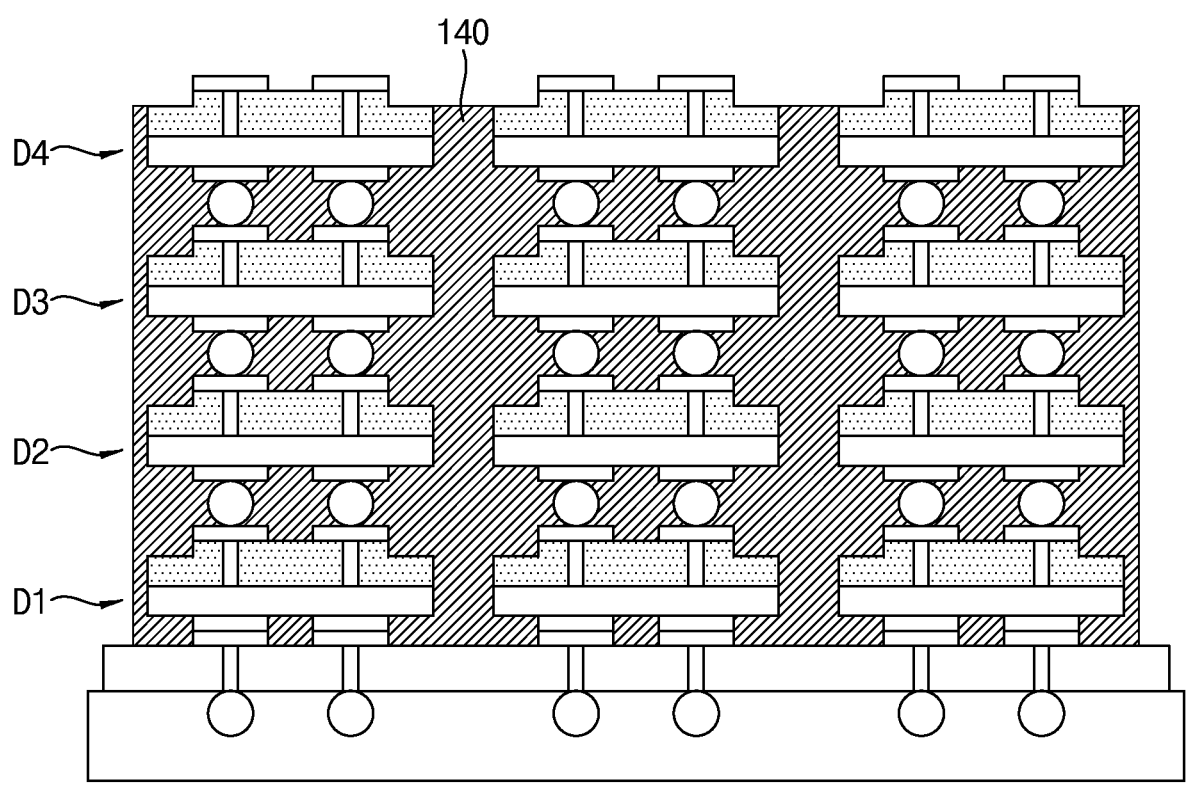

Referring to FIG. 29, the under-fill material 140a deposited on the wafer may be sintered to form an under-fill layer 140.

As described above, prior to forming the under-fill layer 140, the edge portions of the first memory die D1, the second memory die D2, and the third memory die D3 may be removed by a desired (and/or alternatively predetermined) thickness during the stacking of the first memory die D1, the second memory die D2, and the third memory die D3. As a result, the under-fill layer 140 may be limited and/or prevented from remaining on the top surfaces of the first memory die D1, the second memory die D2, and the third memory die D3 so as to facilitate the stacking of the first to fourth memory dies D1, D2, D3, and D4.

Prior to a scribing process, an EMC layer may be formed to protect the semiconductor memory apparatus 100 from EMI. Subsequently, the scribing process may be performed to cut the wafer into individual chip package units.

In the method of manufacturing the semiconductor memory apparatus according to some embodiments of inventive concepts, since an interposer is not disposed, it may be unnecessary to apply an interposer wafer during a manufacturing process. Accordingly, one wafer may be saved during the manufacturing of the semiconductor memory apparatus 100 and thus, manufacturing costs may be reduced. In addition, since memory die stacks may be disposed adjacent to each other, a distance between scribe lanes may be reduced, and more semiconductor memory apparatuses 100 may be manufactured using one wafer.

According to the example embodiments of inventive concepts, chips of the same kind can be stacked without using an interposer, and a size of individual chips can be reduced so as to reduce a size of a semiconductor memory apparatus.

According to the example embodiments of inventive concepts, manufacturing costs can be reduced by stacking chips of the same kind without using an interposer.

According to the example embodiments of inventive concepts, since an interposer is not disposed, it may be unnecessary to apply an interposer during a manufacturing process. Thus, one wafer can be saved during the manufacturing of a semiconductor memory apparatus and thus, manufacturing costs can be reduced.

According to the example embodiments of inventive concepts, memory die stacks can be disposed adjacent to each other so that a distance between scribe lanes can be reduced, and more semiconductor memory apparatuses can be manufactured using one wafer.

While embodiments of inventive concepts have been described with reference to the accompanying drawings, it should be understood by those skilled in the art that various modifications may be made without departing from the scope of inventive concepts and without changing essential features thereof. Therefore, the above-described embodiments should be considered in a descriptive sense only and not for purposes of limitation.

What is claimed is:

1. A method of manufacturing a semiconductor memory apparatus in which a plurality of memory dies are stacked, the method comprising:

forming a plurality of first memory dies on a wafer;

depositing an under-fill material on the wafer including the plurality of first memory dies formed thereon to form a first part of an under-fill layer, the first part of the under-fill layer including a first portion of the under-fill layer remaining on top surfaces of the plurality of first memory dies;

performing a first half sawing process, the first half sawing process removing the first portion of the under-fill layer, the first half sawing process removing parts of edge portions of the plurality of first memory dies to form first cavities during the removing the first portion of the under-fill layer;

forming a plurality of second memory dies on the plurality of first memory dies;

depositing the under-fill material on the wafer including the plurality of second memory dies formed thereon to form a second part of the under-fill layer on a remaining part of the under-fill layer, the second part of the under-fill layer including a second portion of the under-fill layer remaining on top surfaces of the plurality of second memory dies; and performing a second half sawing process, the second half sawing process removing the second portion of the under-fill layer, the second half sawing process removing parts of edge portions of the plurality of second memory dies to form second cavities during the removing the second portion of the under-fill layer.

2. The method of claim 1, wherein
the performing the first half sawing process removes edge portions of four surfaces of each of the plurality of first memory dies by a desired thickness to form the first cavities, and
the performing the second half sawing process removes edge portions of four surfaces of each of the plurality of second memory dies by a desired thickness to form the second cavities.

3. The method of claim 2, wherein
the performing the first half sawing process forms each of the first cavities such that each of the edge portions of the first memory dies has a thickness of 5 μm or more, and
the performing the second half sawing process forms each of the second cavities such that each of the edge portions of the second memory dies has a thickness of 5 μm or more.

4. The method of claim 2, wherein
the performing the first half sawing process forms each of the first cavities to have a width that is less than half of a width of each of the first memory dies, and
the performing the second half sawing process forms each of the second cavities to have a width that is less than half of a width of each of the plurality of second memory dies.

5. The method of claim 1, further comprising:
forming a plurality of third memory dies on the plurality of second memory dies;
depositing the under-fill material on the wafer including the plurality of third memory dies formed thereon to form a third part of the under-fill layer on the remaining part of the under-fill layer, the third part of the under-fill layer including a third portion of the under-filler layer remaining on top surfaces of the plurality of third memory dies; and
performing a third half sawing process, the third half sawing process removing the third portion of the under-fill layer, the third half sawing process removing parts of edge portions of the third memory dies to form third cavities during the removing the third portion of the under-fill layer.

6. The method of claim 5, wherein the performing the third half sawing process removes edge portions of four surfaces of each of the plurality of third memory dies by a desired thickness to form the third cavities.

7. The method of claim 5, wherein the performing the third half sawing process forms each of the third cavities such that each of the edge portions of the plurality of third memory dies has a thickness of 5 μm or more.

8. The method of claim 5, wherein the performing the third half sawing process forms each of the third cavities to have a width that is less than half of a width of each of the plurality of third memory dies.

9. The method of claim 5, further comprising:
forming a plurality of fourth memory dies on the plurality of third memory dies;
depositing the under-fill material on the wafer including the plurality of fourth memory dies formed thereon to form a fourth part of the under-fill layer on the remaining part of the under-fill layer; and
cutting the wafer along a scribe lane.

10. A method of manufacturing a semiconductor memory apparatus in which a plurality of memory dies are stacked, the method comprising:
forming a plurality of first memory dies on a wafer;
removing parts of edge portions of the plurality of first memory dies to form first cavities;
depositing an under-fill material on the wafer including the plurality of first memory dies formed thereon to form a first part of an under-fill layer;
forming a plurality of second memory dies on the plurality of first memory dies;
removing parts of edge portions of the plurality of second memory dies to form second cavities; and
depositing the under-fill material on the wafer including the plurality of second memory dies formed thereon to form a second part of the under-fill layer.

11. The method of claim 10, wherein
the removing parts of edge portions of the plurality of first memory dies removes edge portions of four surfaces of each of the plurality of first memory dies by a desired thickness to form the first cavities, and
the removing parts of edge portions of the plurality of second memory dies removes edge portions of four surfaces of each of the plurality of second memory dies by a desired thickness to form the second cavities.

12. The method of claim 10, wherein
the removing parts of edge portions of the plurality of first memory dies forms each of the first cavities such that each of the edge portions of the first memory dies has a thickness of 5 μm or more, and
the removing parts of edge portions of the plurality of second memory dies forms each of the second cavities such that each of the edge portions of the second memory dies has a thickness of 5 μm or more.

13. The method of claim 10, wherein
the removing parts of edge portions of the plurality of first memory dies forms each of the first cavities to have a width less than half of a width of each of the plurality of first memory dies, and
the removing parts of edge portions of the plurality of second memory dies forms each of the second cavities to have a width less than half of a width of each of the plurality of second memory dies.

14. The method of claim 10, further comprising:
forming a plurality of third memory dies on the plurality of second memory dies;
removing parts of edge portions of the plurality of third memory dies to form third cavities; and
depositing the under-fill material on the wafer including the plurality of third memory dies formed thereon to form a third part of the under-fill layer.

15. The method of claim 14, wherein
the removing parts of the edge portions of the plurality of third memory dies includes removing edge portions of four surfaces of each of the plurality of third memory dies by a desired thickness to form the third cavities.

16. The method of claim 14, wherein the removing parts of the edge portions of the plurality of third memory dies forms each of the third cavities such that each of the edge portions of the plurality of third memory dies has a thickness of 5 μm or more.

17. The method of claim 14, wherein the removing parts of the edge portions of the plurality of third memory dies forms each of the third cavities to have a width less than half of a width of each of the plurality of third memory dies.

18. The method of claim 14, further comprising:
forming a plurality of fourth memory dies on the plurality of third memory dies;
depositing the under-fill material on the wafer including the plurality of fourth memory dies formed thereon to form a fourth part of the under-fill layer; and
cutting the wafer along a scribe lane.

19. A semiconductor memory apparatus comprising:
- a first memory die on a substrate, the first memory die including a step between an edge portion and a top surface of the first memory die, the step of the first memory die being defined by a part of the edge portion of the first memory die being removed;
- a second memory die on the first memory die, the second memory die including a step between an edge portion and a top surface of the second memory die, the step of the second memory die being defined by a part of the edge portion of the second memory die being removed;
- a third memory die on the second memory die, the third memory die including a step between an edge portion and a top surface of the third memory die, the step of the third memory die being defined by a part of the edge portion of the third memory die being removed; and
- a fourth memory die on the third memory die.

20. The semiconductor memory apparatus of claim 19, wherein
- the first cavity, second cavity, and third cavity, are respectively defined by edge portions of four surfaces of each of the first memory die, second memory die, and third memory dies being removed by a desired thickness,
  - each of the edge portions of the first memory die, second memory die, and third memory die has a thickness of 5 μm or more, and
  - each of the first cavity, second cavity, and third cavity has a width that is less than half of a width of each of the first memory die, second memory die, and third memory die.

* * * * *